US012733363B2

(12) United States Patent
Park et al.

(10) Patent No.: US 12,733,363 B2
(45) Date of Patent: Sep. 8, 2026

(54) DISPLAY PANEL AND ELECTRONIC DEVICE INCLUDING THE SAME

(71) Applicant: Samsung Display Co., Ltd., Yongin-si (KR)

(72) Inventors: Hyunae Park, Hwaseong-si (KR); Jaewon Kim, Cheongju-si (KR); Seungwoo Sung, Cheonan-si (KR); Jun-yong An, Asan-si (KR); Nuree Um, Hwaseong-si (KR); Ji-eun Lee, Seoul (KR); Yun-kyeong In, Hwaseong-si (KR); Donghyeon Jang, Suwon-si (KR); Seunghan Jo, Seoul (KR); Junyoung Jo, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 19/215,548

(22) Filed: May 22, 2025

(65) Prior Publication Data

US 2025/0287798 A1 Sep. 11, 2025

Related U.S. Application Data

(63) Continuation of application No. 18/426,231, filed on Jan. 29, 2024, now Pat. No. 12,329,005, which is a (Continued)

(30) Foreign Application Priority Data

Nov. 30, 2018 (KR) ........................ 10-2018-0152675

(51) Int. Cl.
*G09G 5/00* (2006.01)
*G09G 3/3225* (2016.01)
(Continued)

(52) U.S. Cl.
CPC ......... *H10K 59/131* (2023.02); *G09G 3/3225* (2013.01); *G09G 3/3266* (2013.01);
(Continued)

(58) Field of Classification Search
CPC .. H10K 59/1315; H10K 50/841; H10K 59/40; H10K 59/65; H10K 59/1213;
(Continued)

(56) References Cited

U.S. PATENT DOCUMENTS 9,940,888 B2 4/2018 Ryoo et al.
10,347,700 B2 7/2019 Yang et al.
(Continued)

FOREIGN PATENT DOCUMENTS

CN 106252374 A 12/2016
CN 107230693 A 10/2017
(Continued)

OTHER PUBLICATIONS

Extended European Search Report dated May 6, 2020, in European Patent Application No. 19211087.2.
(Continued)

*Primary Examiner* — Jennifer T Nguyen
(74) *Attorney, Agent, or Firm* — CANTOR COLBURN LLP

(57) ABSTRACT

A display panel including a first panel region (FPR) including (n−1)-th and n-th pixel rows ((n−1)PR and nPR), and a second panel region (SPR) dividing the nPR to propagate an optical signal. The display panel includes a circuit element layer (CEL) and a display element layer (DEL). The CEL includes a signal line (SL), a pixel driving circuit (PDC), and first to third regions. The SL and the PDC are in the first region. The second region (SR) corresponds to the SPR. The SL and the PDC are not in the SR. The third region (TR) corresponds to the SPR and is along a periphery of the SR.
(Continued)

The SL is in the TR, and includes an (n−1)-th scan line ((n−1)SL) connected to the (n−1)PR, an n-th reset line (nRL) connected to the nPR, and a first row connection line in the TR and connecting the (n−1)SL and the nRL.

12 Claims, 23 Drawing Sheets

Related U.S. Application Data continuation of application No. 17/991,692, filed on Nov. 21, 2022, now Pat. No. 11,895,889, which is a continuation of application No. 17/465,420, filed on Sep. 2, 2021, now Pat. No. 11,515,385, which is a continuation of application No. 16/687,917, filed on Nov. 19, 2019, now Pat. No. 11,114,523.

(51) Int. Cl.

| | |
|---|---|
| ***G09G 3/3266*** | (2016.01) |
| ***H10K 50/84*** | (2023.01) |
| ***H10K 50/86*** | (2023.01) |
| ***H10K 59/121*** | (2023.01) |
| ***H10K 59/123*** | (2023.01) |
| ***H10K 59/131*** | (2023.01) |
| ***H10K 59/40*** | (2023.01) |
| ***H10K 59/88*** | (2023.01) |
| *H10D 86/40* | (2025.01) |
| *H10D 86/60* | (2025.01) |
| *H10K 59/65* | (2023.01) |
| *H10K 59/80* | (2023.01) |

(52) U.S. Cl.

CPC .......... *H10K 50/841* (2023.02); *H10K 50/86* (2023.02); *H10K 59/1213* (2023.02); *H10K 59/1216* (2023.02); *H10K 59/123* (2023.02); *H10K 59/1315* (2023.02); *H10K 59/40* (2023.02); *H10K 59/88* (2023.02); *G09G 2300/0426* (2013.01); *G09G 2300/08* (2013.01); *H10D 86/441* (2025.01); *H10D 86/481* (2025.01); *H10D 86/60* (2025.01); *H10K 59/65* (2023.02); *H10K 59/871* (2023.02); *H10K 59/8791* (2023.02)

(58) Field of Classification Search

CPC .. H10K 59/88; H10K 59/1216; H10K 59/123; G09G 3/3225; G09G 3/3266; G09G 2300/0426; G09G 2300/08

USPC .......................................................... 345/204

See application file for complete search history.

(56) References Cited

U.S. PATENT DOCUMENTS

| | | | | |
|---|---|---|---|---|
| 11,111,523 | B2 | 9/2021 | Suwara et al. | |
| 11,114,523 | B2 | 9/2021 | Park et al. | |
| 11,515,385 | B2 | 11/2022 | Park et al. | |
| 12,329,005 | B2 * | 6/2025 | Park | H10K 59/40 |
| 2010/0053058 | A1 | 3/2010 | Nagashima et al. | |
| 2011/0222645 | A1 | 9/2011 | Tobita | |
| 2014/0197428 | A1 | 7/2014 | Wang et al. | |
| 2016/0363909 | A1 * | 12/2016 | Kang | G04C 17/0091 |
| 2017/0162637 | A1 * | 6/2017 | Choi | H01L 21/28 |
| 2017/0294502 | A1 * | 10/2017 | Ka | H10K 71/00 |
| 2018/0151660 | A1 | 5/2018 | Kim et al. | |
| 2018/0279456 | A1 | 9/2018 | Melo | |
| 2018/0315357 | A1 | 11/2018 | Nam et al. | |
| 2019/0130822 | A1 | 5/2019 | Jung et al. | |
| 2019/0189232 | A1 | 6/2019 | Wang | |
| 2019/0259349 | A1 * | 8/2019 | Kaise | G02F 1/134309 |
| 2019/0261512 | A1 | 8/2019 | Huang et al. | |
| 2020/0212357 | A1 | 7/2020 | Lim et al. | |
| 2021/0343823 | A1 | 11/2021 | Tanaka et al. | |

FOREIGN PATENT DOCUMENTS

| | | |
|---|---|---|
| CN | 107863374 | 3/2018 |
| KR | 10-2014-0086708 | 7/2014 |
| KR | 10-2016-0147116 | 12/2016 |
| KR | 10-2017-0064598 | 6/2017 |
| KR | 10-2017-0113066 | 10/2017 |
| KR | 10-2017-0113822 | 10/2017 |

OTHER PUBLICATIONS

Non-Final Office Action issued Sep. 30, 2020, in U.S. Appl. No. 16/687,917.

Final Office Action issued Jan. 22, 2021, in U.S. Appl. No. 16/687,917.

Notice of Allowance issued Apr. 29, 2021, in U.S. Appl. No. 16/687,917.

Non-Final Office Action dated Jan. 31, 2022, issued to U.S. Appl. No. 17/465,420.

Notice of Allowance dated Jul. 27, 2022, issued to U.S. Appl. No. 17/465,420.

Office Action issued from the Korean Patent Office on Nov. 24, 2023 for Korean Patent Application No. 2018-0152675 (with English Translation).

Non-Final Office Action dated Mar. 16, 2023, issued to U.S. Appl. No. 17/991,692.

Final Office Action dated Jul. 5, 2023, issued to U.S. Appl. No. 17/991,692.

Notice of Allowance dated Sep. 18, 2023, issued to U.S. Appl. No. 17/991,692.

Supplemental Notice of Allowability dated Dec. 27, 2023, issued to U.S. Appl. No. 17/991,692.

* cited by examiner

PXLn
DR1
DR3
DR2
CLA1
CTH1
CLA3
DML1 GV
DP-TA2
CLA2
CLA3
CLA-D
PX-D
CLA3
DML1 GV
DP-TA1
CLA2
CLA3
PX
CTH1
CLA1
GLn
RLn

PX
PX-D
NPXA
PXA
NPXA
NPXA
PXA
NPXA
OLED
AE HCL EML ECL CE
OLED
HCL EML ECL CE
TFL
DP-OLED
PDL
OP
L50
CH4
CNE
CH3
DP-CL
L40
CH1
CH2
L30
L20
L10
BFL
BL
SE SCP GE DE
T1
DR3
DR1

DLm
PXCm
LPU
DP-TA
PX
CTH2
Sn-1
Sn
Sn+1
PXLn-1
PXLn
PXLn+1
S-LPL
R-LPL
DML2
CTH2
R-LPR
S-LPR
LPD
GV
MH
DR1
DR2
DR3
DP-BA
CLA1
CLA3
CLA2
CLA3
CLA1
DP-BA

DISPLAY PANEL AND ELECTRONIC DEVICE INCLUDING THE SAME

CROSS-REFERENCE TO RELATED APPLICATIONS

This application is a Continuation of U.S. patent application Ser. No. 18/426,231, filed on Jan. 29, 2024, which is a Continuation of U.S. patent application Ser. No. 17/991,692, filed on Nov. 21, 2022, which is a Continuation of U.S. patent application Ser. No. 17/465,420, filed on Sep. 2, 2021, now issued as U.S. Pat. No. 11,515,385, which is a Continuation of U.S. patent application Ser. No. 16/687,917, filed Nov. 19, 2019, now issued as U.S. Pat. No. 11,114,523, which claims priority to and the benefit of Korean Patent Application No. 10-2018-0152675, filed Nov. 30, 2018, both of which are hereby incorporated by reference for all purposes as if fully set forth herein.

BACKGROUND

Field

Exemplary embodiments generally relate to a display panel and an electronic device including the same, and, more particularly, to a display panel including a signal passing region in which an optical signal translates, and an electronic device including the same.

Discussion

Portable electronic devices have become widespread, and the functions of these portable electronic devices are becoming more and more diverse. Some users typically prefer an electronic device with a larger display region and a smaller non-display region. As such, various shapes of electronic devices are being developed to reduce the area of a non-display region.

The above information disclosed in this section is only for understanding the background of the inventive concepts, and, therefore, may contain information that does not form prior art.

SUMMARY

Some exemplary embodiments are capable of providing a display panel having a relatively large display region and a relatively small non-display region.

Some exemplary embodiments are capable of providing an electronic device including a display panel having a relatively large display region and a relatively small non-display region.

Additional aspects will be set forth in the detailed description which follows, and, in part, will be apparent from the disclosure, or may be learned by practice of the inventive concepts.

According to some exemplary embodiments, an electronic device includes a display panel. The display panel includes a first panel region and a second panel region. An (n−1)-th pixel row and an n-th pixel row being disposed in the first panel region, "n" being a natural number. The second panel region dividing at least the n-th pixel row into at least two portions. The second panel region being configured to allow propagation of an optical signal. The display panel includes a base layer, a circuit element layer, and a display element layer. The circuit element layer is disposed on the base layer. The circuit element layer includes a signal line and a pixel driving circuit. The display element layer is disposed on the circuit element layer. The display element layer includes a display element. The circuit element layer includes a first region, a second region, and a third region. The signal line and the pixel driving circuit are disposed in the first region. The second region corresponds to the second panel region. The signal line and the pixel driving circuit are not disposed in the second region. The third region corresponds to the second panel region and is disposed along a periphery of the second region. The signal line is disposed in the third region. The signal line includes an (n−1)-th scan line connected to the (n−1)-th pixel row, an n-th reset line connected to the n-th pixel row, and a first row connection line connecting the (n−1)-th scan line and the n-th reset line. The first row connection line is disposed in the third region.

According to some exemplary embodiments, an electronic device includes a display panel and an optical film. The display panel includes a first panel region and a second panel region. The first panel region includes a first pixel, a second pixel disposed in a same pixel row as the first pixel, a third pixel disposed in a pixel row different from the pixel row of the first pixel and the second pixel, and a fourth pixel disposed in a same pixel row as the third pixel. The second panel region has greater light transmittance than the first panel region. The first pixel, the second pixel, the third pixel, and the fourth pixel are disposed outside the second panel region. The optical film is disposed on the display panel. The display panel further includes a circuit element layer including a signal line, and pixel driving circuits configured to respectively drive the first pixel, the second pixel, the third pixel, and the fourth pixel. The circuit element layer includes first to third regions. The signal line and the pixel driving circuits are disposed in the first region. The second region corresponds to the second panel region. The signal line and the pixel driving circuits are disposed outside the second region. The third region is disposed along a periphery of the second region. The signal line is disposed in the third region. The signal line includes a connection line disposed in the third region. The connection line is electrically connected to the first pixel, the second pixel, the third pixel, and the fourth pixel.

According to some exemplary embodiments, an electronic device includes a display panel. The display panel includes a first panel region, a second panel region, and a third panel region. An (n−1)-th pixel row and an n-th pixel row are disposed in the first panel region, "n" being a natural number. The second panel region divides at least the n-th pixel row into at least two portions. The second panel region is configured to allow propagation of an optical signal. The third panel region is disposed outside the first panel region and the second panel region. The display panel includes a base layer, a circuit element layer, and a display element layer. The circuit element layer is disposed on the base layer. The circuit element layer includes a row signal line, a column signal line, a pixel driving circuit, a first scan driving circuit, and a second scan driving circuit. The display element layer is disposed on the circuit element layer. The display element layer includes a display element. The circuit element layer includes first to fifth regions. The row signal line, the column signal line, and the pixel driving circuit are disposed in the first region. The second region corresponds to the second panel region. The row signal line, the column signal line, and the pixel driving circuit being disposed outside the second region. The third region is disposed on a periphery of the second region. At least the column signal line is disposed in the third region. The fourth region corresponds to the third panel region. The first scan driving circuit being disposed in the fourth region. The fifth region corresponds to the third panel region. The second scan driving circuit being disposed in the fifth region. The first region is disposed between the fourth region and the fifth region. Each of the (n−1)-th pixel row and the n-th pixel row includes one-side pixels adjacent to one side of the second panel region, and another-side pixels adjacent to another side of the second panel region. The row signal line includes an (n−1)-th one-side scan line connected to the one-side pixels of the (n−1)-th pixel row and the first scan driving circuit, an (n−1)-th another-side scan line connected to the another-side pixels of the (n−1)-th pixel row and the second scan driving circuit, an n-th one-side reset line connected to the one-side pixels of the n-th pixel row and the first scan driving circuit, and an n-th another-side reset line connected to the another-side pixels of the n-th pixel row and the second scan driving circuit.

According to some exemplary embodiments, a display panel includes a first panel region and a second panel region. An (n−1)-th pixel row ("n" being a natural number), an n-th pixel row, an (n−1)-th scan line connected to the (n−1)-th pixel row, an (n−1)-th reset line connected to the (n−1)-th pixel row, an n-th scan line connected to the n-th pixel row, and an n-th reset line connected to the n-th pixel row are disposed in the first panel region. The second panel region divides at least the n-th pixel row into at least two portions. The second panel region includes an opening and a surrounding region. The surrounding region is disposed along a periphery of the opening. A connection line connecting the (n−1)-th scan line and the n-th reset line is disposed in the surrounding region.

The foregoing general description and the following detailed description are exemplary and explanatory and are intended to provide further explanation of the claimed subject matter.

BRIEF DESCRIPTION OF THE FIGURES

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts. In the drawings.

DETAILED DESCRIPTION OF THE ILLUSTRATED EMBODIMENTS

Figure 1:
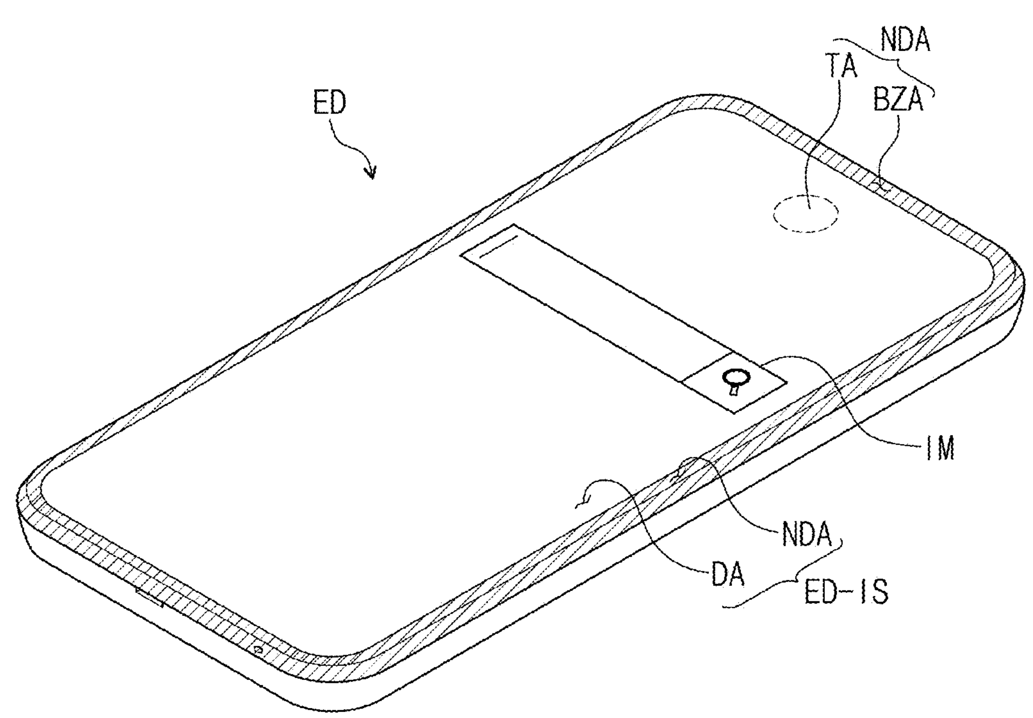
FIG. 1 is a perspective view illustrating an electronic device according to some exemplary embodiments.
Figure 1:
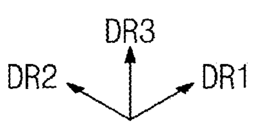

In the following description, for the purposes of explanation, numerous specific details are set forth in order to provide a thorough understanding of various exemplary embodiments. As used herein, the terms "embodiments" and "implementations" are used interchangeably and are non-limiting examples employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Hereinafter, various exemplary embodiments will be explained in detail with reference to the accompanying drawings.

Figure 2:
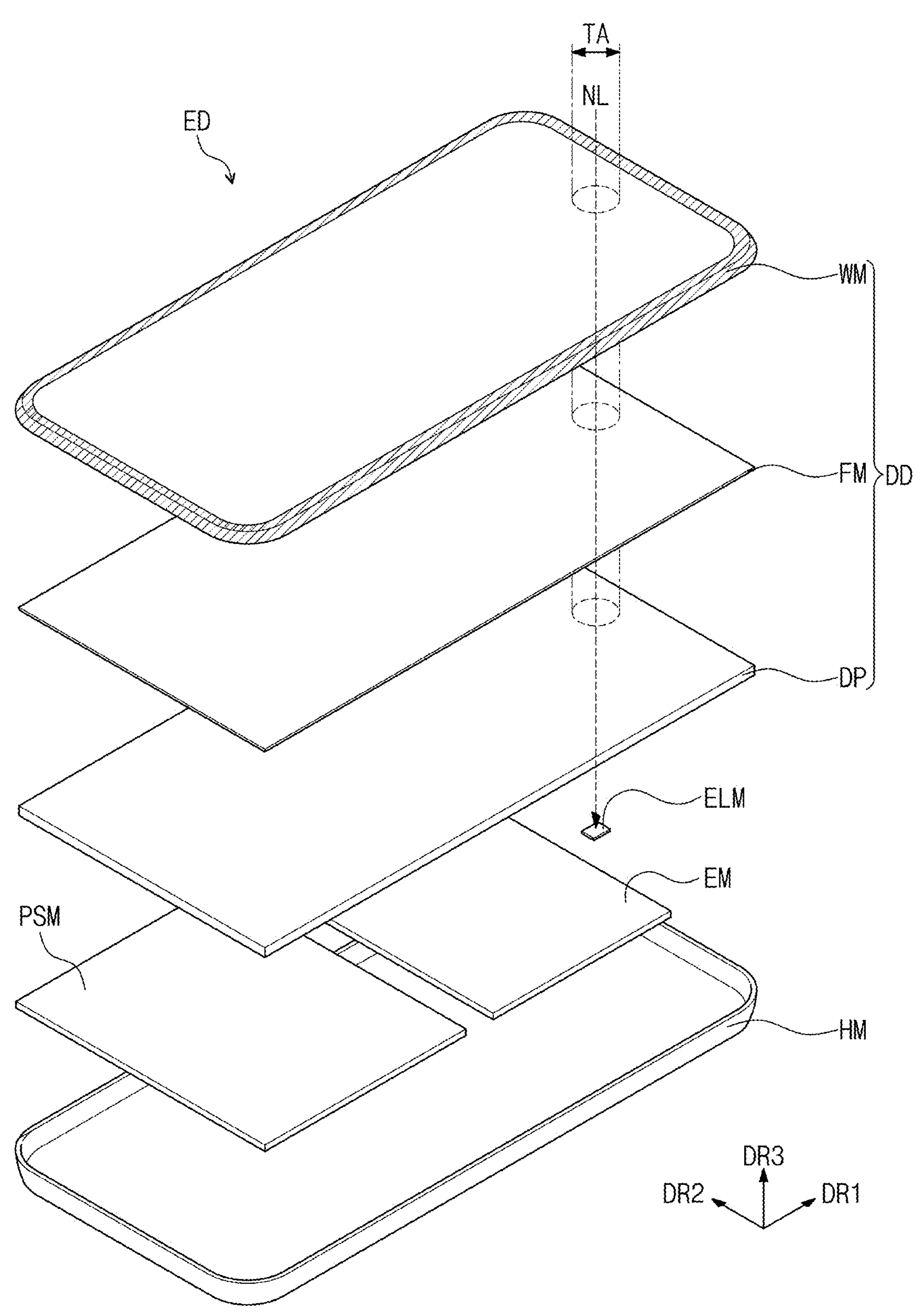
FIG. 2 is an exploded perspective view illustrating the electronic device of FIG. 1 according to some exemplary embodiments.
Figure 3:
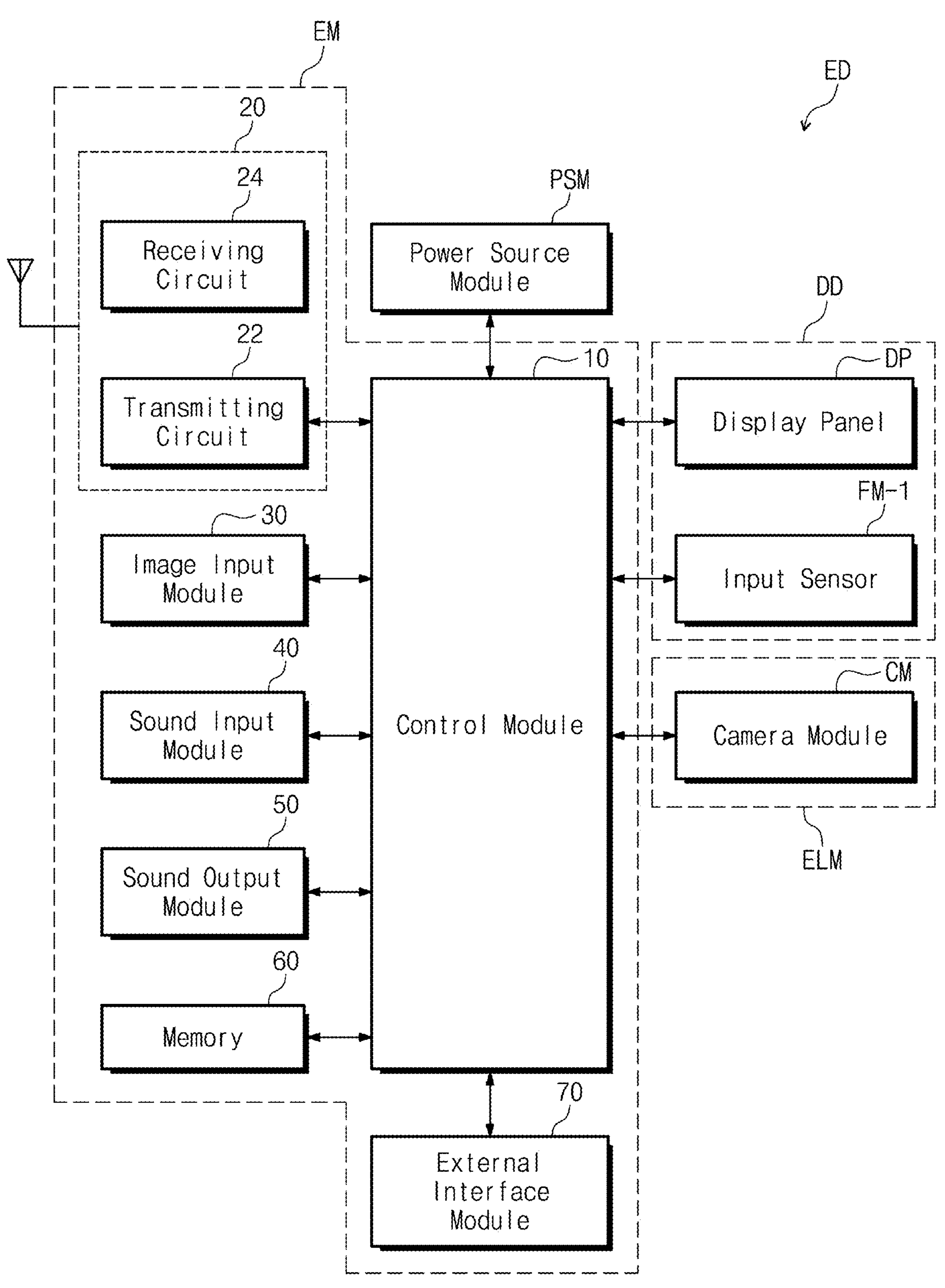
FIG. 3 is a block diagram illustrating the electronic device of FIG. 1 according to some exemplary embodiments.

FIG. 1 is a perspective view illustrating an electronic device according to some exemplary embodiments. FIG. 2 is an exploded perspective view illustrating the electronic device of FIG. 1 according to some exemplary embodiments. FIG. 3 is a block diagram illustrating the electronic device of FIG. 1 according to some exemplary embodiments.

As illustrated in FIG. 1, an electronic device ED may display an image IM on a display surface ED-IS. The display surface ED-IS is parallel to a plane defined by a first direction axis DR1 and a second direction axis DR2. A normal direction of the display surface ED-IS, that is, a thickness direction of the electronic device ED is indicated by a third direction axis DR3. The display surface ED-IS of the electronic device ED corresponds to a front surface of the electronic device ED, and may correspond to a top surface of a window WM.

A front surface (or a top surface) and a rear surface (or a bottom surface) of each of members, layers, or units described hereinafter are distinguished by the third direction axis DR3. However, the first to third direction axes DR1, DR2, and DR3 are merely illustrative. Hereinafter, first to third directions are defined as directions indicated by the first to third direction axes DR1, DR2, and DR3 respectively, and refer to the same reference numerals.

The display surface ED-IS includes a display region DA, and a non-display region NDA adjacent to (e.g., outside) the display region DA. The non-display region NDA is a region in which an image is not displayed. The non-display region NDA may include a bezel region BZA and a signal passing region TA. The signal passing region TA is a region in which an optical signal may be transmitted. One signal passing region TA is illustrated by way of example, but exemplary embodiments are not limited thereto. An optical signal may be external natural light, or may be, for example, infrared rays generated from a light-emitting element.

The bezel region BZA is a region for blocking an optical signal, and may be a region disposed outside the display region DA to surround the display region DA. In some exemplary embodiments, the bezel region BZA may be disposed on a side surface of the electronic device ED instead of a front surface of the electronic device ED. In some exemplary embodiments, the bezel region BZA may be omitted.

In some exemplary embodiments, the bezel region BZA is illustrated, by way of example, to surround the display region DA, but exemplary embodiments are not limited thereto. It suffices that the bezel region BZA is disposed on one side of the display region DA. The bezel region BZA may also be disposed only in regions facing each other in a first direction DR1.

A flat display surface ED-IS is exemplarily illustrated, but, according to some exemplary embodiments, curved regions may also be included, such as on opposite sides of the display surface ED-IS facing each other in, for instance, a second direction DR2.

Although a mobile phone is exemplarily illustrated as the electronic device ED, exemplary embodiments of the electronic device ED is not limited thereto. For instance, the electronic device ED may be modified to be implemented as various information providing devices such as a television, a navigational device, a computer monitor, a game machine, etc.

As illustrated in FIGS. 2 and 3, the electronic device ED may include a display device DD, an electronic module EM, an electro-optical module ELM, a power source module PSM, and a housing HM.

The display device DD generates an image IM. The display device DD includes a display panel DP, an optional member FM, and a window WM.

The display panel DP is not particularly limited, and may be a light-emitting display panel, such as an organic light-emitting display panel and a quantum dot light-emitting display panel.

Depending on a configuration of the optional member FM, the display device DD may also sense an external input and/or an external pressure. As such, the optional member FM may include various members.

In some exemplary embodiments, the optional member FM may include an optical film and an input sensor. An optical film decreases reflectance of external light. An input sensor senses an external input of a user. The optional member FM may further include an adhesive layer for bonding the optical film and the input sensor.

The optical film may include a polarizer and a phase retarder. The polarizer and the phase retarder may be a stretched-type or a coated-type phase retarder. The input sensor may sense an external input by at least one of a capacitive method, a pressure-sensing method, and an electromagnetic induction method.

The window WM provides an outer surface of the electronic device ED. The window WM includes a base layer, and may further include one or more functional layers, such as an anti-reflection layer and an anti-fingerprint layer.

Although not illustrated separately, the display device DD may further include at least one adhesive layer. The adhesive layer may bond the window WM and the optional member FM, or the optional member FM and the display panel DP. The adhesive layer may be an optically transparent adhesive layer or a pressure-sensing adhesive layer.

The electronic module EM may include a control module 10, a wireless communication module 20, an image input module 30, a sound input module 40, a sound output module 50, memory 60, an external interface module 70, and the like. The aforementioned modules may be mounted on a circuit board, or may be electrically interconnected through a flexible circuit board. The electronic module EM is electrically connected to the power source module PSM.

The control module 10 controls overall operations of the electronic device ED. For example, the control module 10 activates or deactivates the display device DD in accordance with, for instance, a user input. The control module 10 may control the image input module 30, the sound input module 40, the sound output module 50, and the like, in accordance with, for example, a user input. The control module 10 may include at least one microprocessor.

The wireless communication module 20 may transmit/receive a radio signal to/from other terminal using a Bluetooth™ or Wi-Fi channel; however, exemplary embodiments are not limited thereto. The wireless communication module 20 may transmit/receive a voice signal using a general communication channel. The wireless communication module 20 includes a transmitting circuit 22 for modulating and transmitting a signal to be transmitted, and a receiving circuit 24 for demodulating a received signal.

The image input module 30 processes an image signal to convert the processed image signal into image data that may be displayed on (or by) the display device DD. The sound input module 40 receives an external sound signal using, for example, a microphone in a recording mode, a voice recognition mode, or the like, so as to convert the received external sound signal into electrical voice data. The sound output module 50 converts sound data received from the wireless communication module 20 or sound data stored in the memory 60 so as to output the converted sound data to the outside.

The external interface module 70 serves as an interface to which an external charger, a wired/wireless data port, a card socket (e.g., a memory card and/or a subscriber identity module (SIM)/user identity module (UIM) card), and the like, are connected.

The power source module PSM supplies power for overall operations of the electronic device ED. The power source module PSM may include a typical battery device.

The housing HM is combined with (or otherwise supports) the display device DD, such as with the window WM, so as to house the other modules. As seen in FIG. 2, the housing HM constituting one member is illustrated by way of example. The housing HM, however, may include two or more components assembled together.

The electro-optical module ELM may be an electronic component for outputting or receiving an optical signal. The electro-optical module ELM transmits or receives an optical signal through a partial region of the display device DD corresponding to the signal passing region TA. In some exemplary embodiments, the electro-optical module ELM may include a camera module CM. The camera module CM receives a natural light signal NL (see, e.g., FIG. 2.) through the signal passing region TA so as to take an external image.

According to some exemplary embodiments, the electro-optical module ELM is disposed below the display device DD. The electro-optical module ELM overlaps the partial region of the display device DD. The partial region of the display device DD has a higher light transmittance relative to another region of the display device DD. Hereinafter, a description will be given in more detail of the display device DD.

Figure 4A:
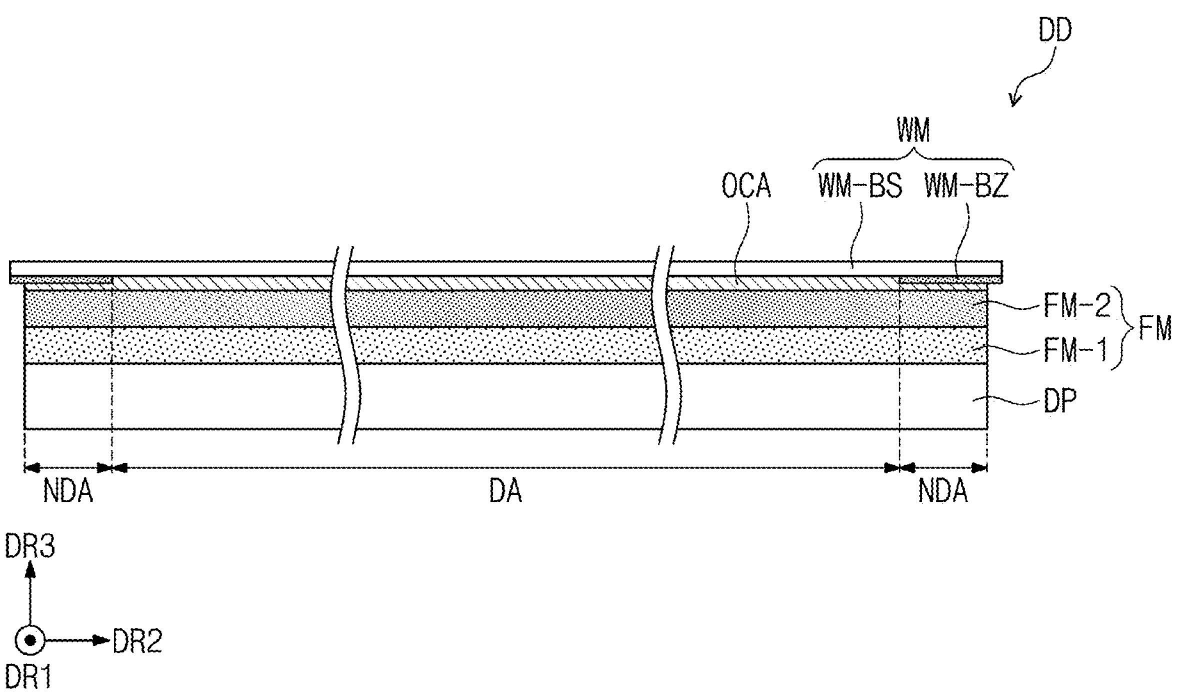
FIGS. 4A and 4B are cross-sectional views illustrating a display device according to some exemplary embodiments.
Figure 4B:
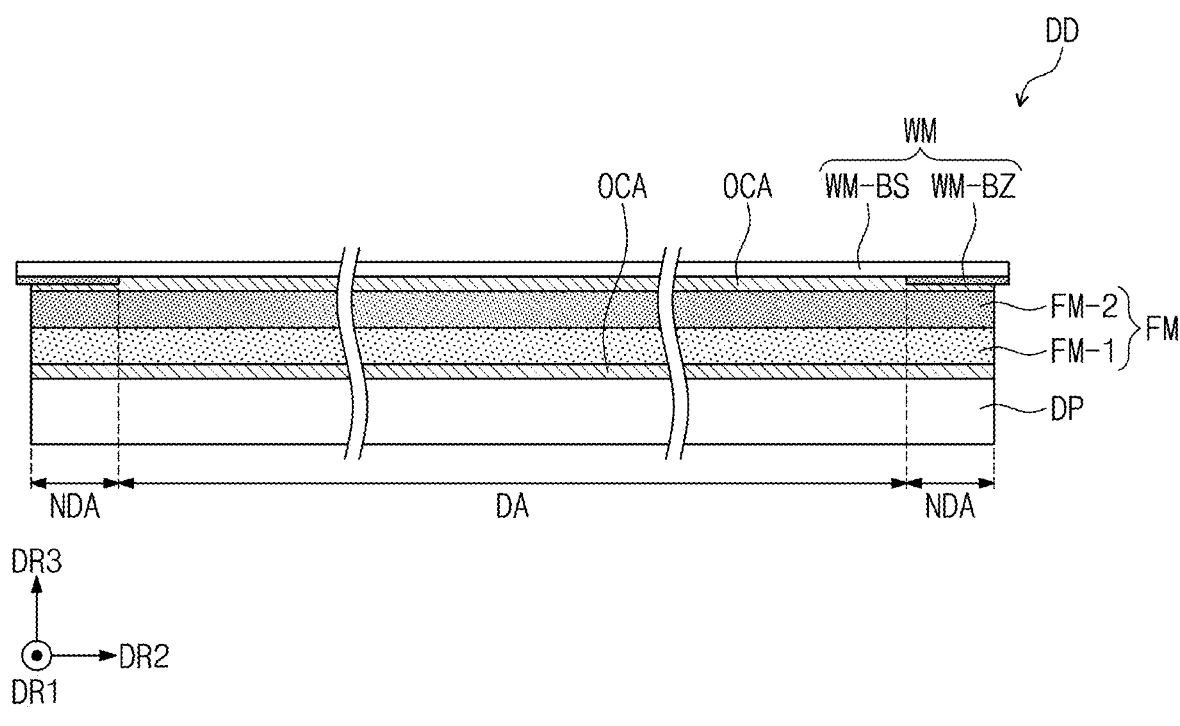

FIGS. 4A and 4B are cross-sectional views illustrating a display device according to some exemplary embodiments. Hereinafter, a detailed description will not be given of a component that is the same as that described referring to FIGS. 1 to 3.

As illustrated in FIGS. 4A and 4B, the display device DD includes the display panel DP, an input sensor FM-1, an optical film FM-2, and the window WM. As illustrated in FIGS. 4A and 4B, the window WM and the optical film FM-2 may be bonded by an adhesive layer OCA.

Although a detailed illustration is not given of the optical film FM-2, the optical film FM-2 may have a multi-layer structure, and the multi-layer structure may include an adhesive layer. By the adhesive layer, the optical film FM-2 may adhere to a top surface of the input sensor FM-1.

In the optical film FM-2, an opening may be formed so as to correspond to the signal passing region TA illustrated in FIG. 2. The opening may enhance transmittance for the natural light signal NL.

As illustrated in FIGS. 4A and 4B, the window WM may include a base substrate WM-BS and a bezel pattern WM-BZ. The base substrate WM-BS includes a transparent substrate, such as a glass substrate. The base substrate WM-BS is not limited thereto, and may include (additionally or alternatively) plastic. A single layer of the base substrate WM-BS is illustrated, but the base substrate WM-BS is not limited thereto. The base substrate WM-BS may include a glass substrate or a plastic substrate, and a synthetic resin film bonded thereto by an adhesive layer.

The bezel pattern WM-BZ may be disposed directly on a bottom surface of the base substrate WM-BS. The bezel pattern WM-BZ may have a multi-layer structure. The multi-layer structure may include a colored color layer and a black shading (or shielding) layer. The colored color layer and the black shading layer may be formed through at least one of deposition, print, and coating processes.

The input sensor FM-1 illustrated in FIG. 4A may be disposed directly on a base surface that the display panel DP provides. For the purposes of this disclosure, a description that "a component B is disposed directly on a component A" means that a separate adhesive layer is not disposed between the component A and the component B. In this manner, the component B is formed through a continuous process on a base surface provided by the component A after the component A has been formed.

As illustrated in FIG. 4B, the input sensor FM-1 may be separately manufactured, and then combined to the display panel DP. As such, an adhesive layer OCA may be disposed between the input sensor FM-1 and the display panel DP.

Figure 5A:
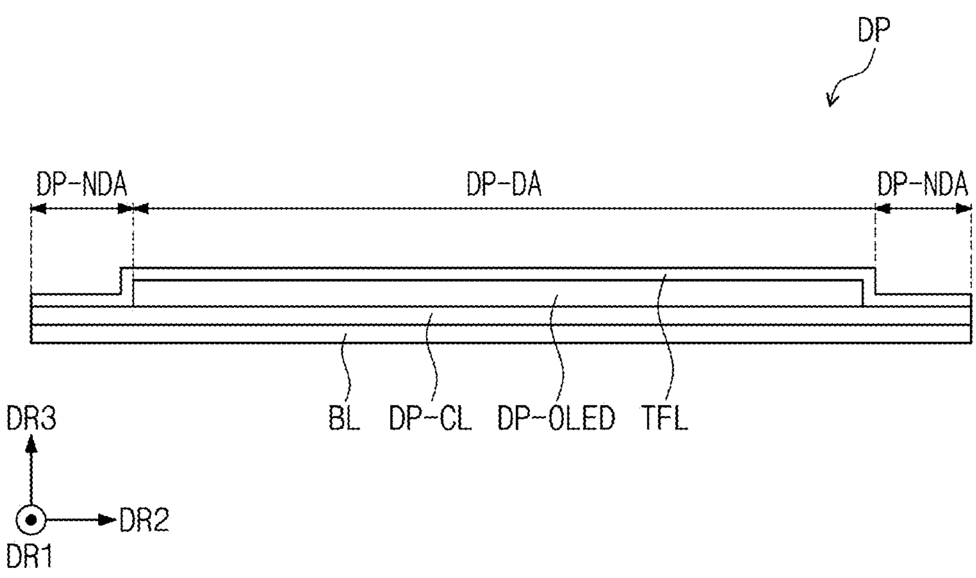
FIG. 5A is a cross-sectional view illustrating a display panel according to some exemplary embodiments.
Figure 5B:
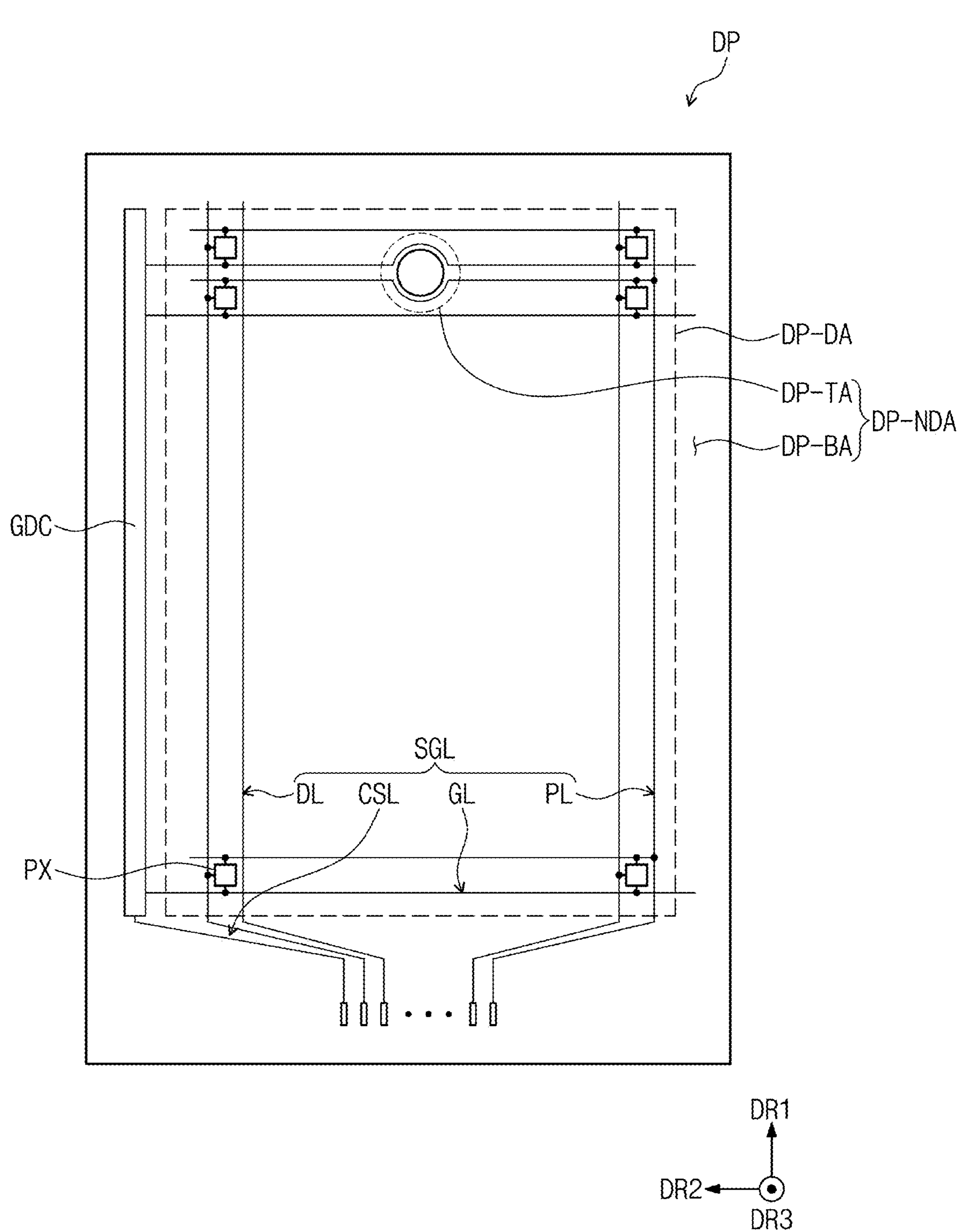
FIG. 5B is a plan view illustrating the display panel of FIG. 5A according to some exemplary embodiments.
Figure 5C:
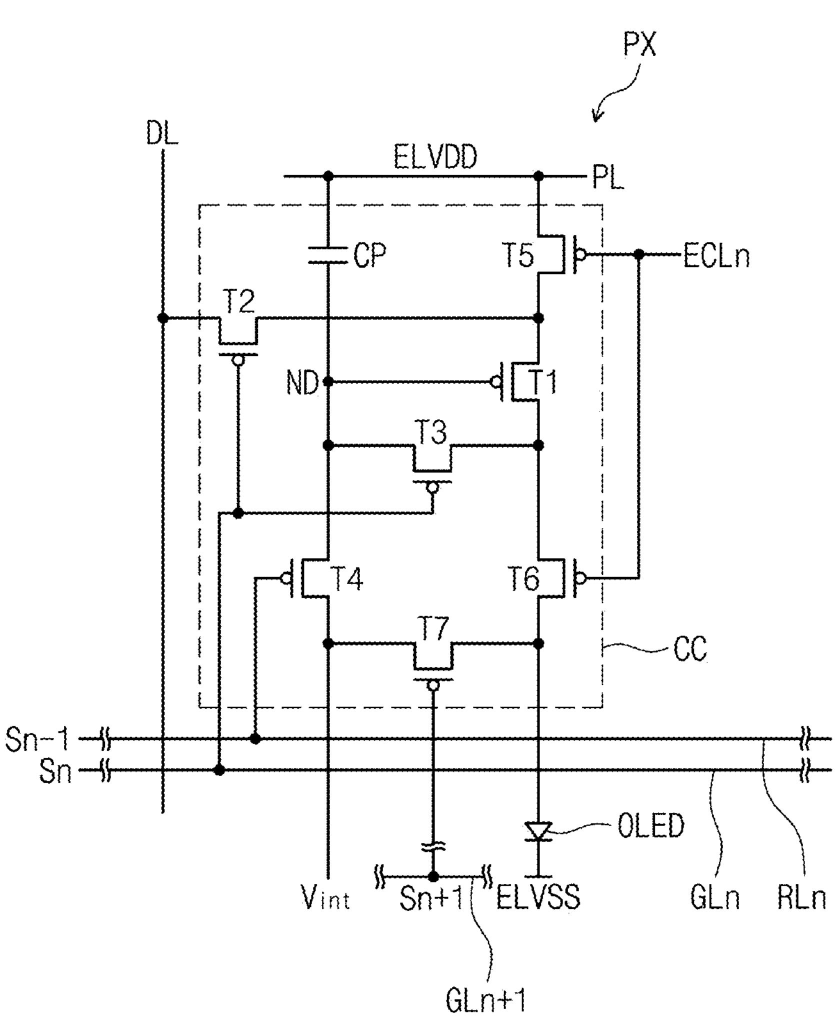
FIG. 5C is an equivalent circuit diagram of a pixel according to some exemplary embodiments.
Figure 5D:
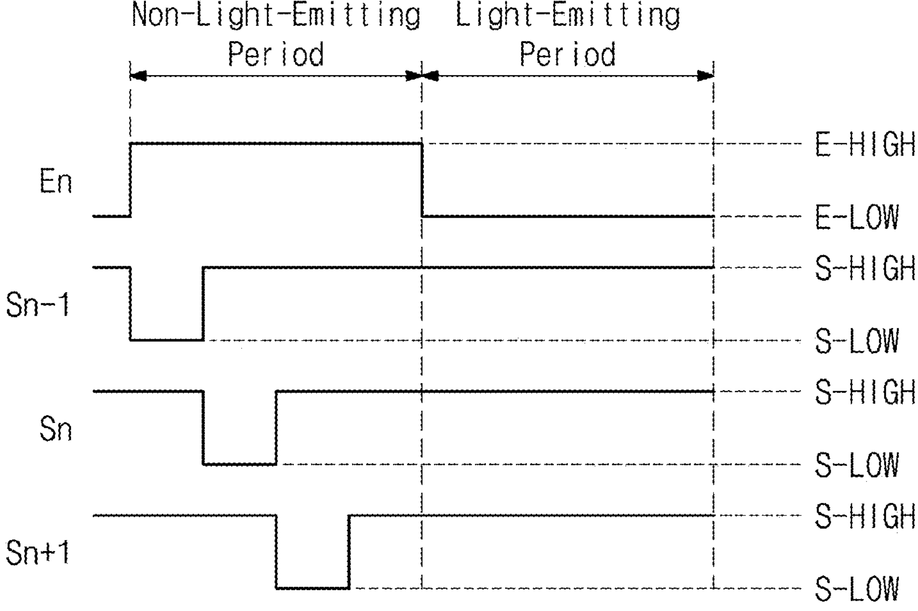
FIG. 5D is a timing diagram illustrating signals applied to the pixel of FIG. 5C according to some exemplary embodiments.

FIG. 5A is a cross-sectional view illustrating a display panel according to some exemplary embodiments. FIG. 5B is a plan view illustrating the display panel of FIG. 5A according to some exemplary embodiments. FIG. 5C is an equivalent circuit diagram of a pixel according to some exemplary embodiments. FIG. 5D is a timing diagram illustrating signals applied to the pixel of FIG. 5C according to some exemplary embodiments.

As illustrated in FIG. 5A, the display panel DP includes a base layer BL, a circuit element layer DP-CL, a display element layer DP-OLED, and an upper insulating layer TFL disposed on the base layer BL. An active region DP-DA and an inactive region DP-NDA respectively corresponding to the display region DA and the non-display region NDA illustrated in FIG. 1 may be defined by the display panel DP. The correspondence of regions of different members, in some exemplary embodiments, means that the regions overlap each other, and the regions are not limited by the correspondence having the same area/shape. In some exemplary embodiments, the active region DP-DA may be defined as a first panel region. The inactive region DP-NDA may include a second panel region and a third panel region respectively corresponding to the signal passing region TA and the bezel region BZA.

The base layer BL may include at least one plastic film. The base layer BL may include at least one of a plastic substrate, a glass substrate, a metal substrate, an organic/inorganic composite substrate, and the like.

The circuit element layer DP-CL includes at least one insulating layer, semiconductor patterns, and conductive patterns. The insulating layer includes at least one inorganic layer and at least one organic layer. The semiconductor patterns and the conductive patterns may constitute signal lines, a pixel driving circuit, and a scan driving circuit. A more detailed description will be given later.

The display element layer DP-OLED includes a display element, for example, an organic light-emitting diode. The display element layer DP-OLED may further include an organic layer, such as a pixel-defining film (or layer).

The upper insulating layer TFL includes a plurality of thin films. Some of the thin films are disposed to enhance optical efficiency, and some other ones of the thin films are disposed to protect the display elements, such as the organic light-emitting diodes. A more detailed description of the upper insulating layer TFL will be given later.

As illustrated in FIG. 5B, the display panel DP may include a plurality of signal lines SGL (hereinafter, signal lines), a plurality of pixels PX (hereinafter, pixels), and a driving circuit GDC. The display panel DP may include a first panel region DP-DA, a second panel region DP-TA, and a third panel region DP-BA.

The pixels PX are arranged in the first panel region DP-DA. Each of the pixels PX includes, for instance, an organic light-emitting diode and a pixel driving circuit connected to the organic light-emitting diode. The signal lines SGL and the pixel driving circuit may be included in the circuit element layer DP-CL illustrated in FIG. 5A.

The pixels PX are not arranged in the second panel region DP-TA. An optical signal moves (or otherwise propagates) through the second panel region DP-TA. The second panel region DP-TA has higher light transmittance than the first panel region DP-DA.

The driving circuit GDC is disposed in the third panel region DP-BA. In some exemplary embodiments, the driving circuit GDC may include a scan driving circuit. The scan driving circuit generates a plurality of scan signals (hereinafter, scan signals), and sequentially outputs the scan signals to a plurality of scan lines GL (hereinafter, scan lines) to be described later. The scan driving circuit may further output another control signal to a driving circuit of the pixels PX.

The scan driving circuit may include a plurality of thin film transistors formed through a process utilized to form at least some of the driving circuit of the pixels PX, for example, a low temperature polycrystalline silicon (LTPS) process or a low temperature polycrystalline oxide (LTPO) process. Accordingly, the scan driving circuit may be included in the circuit element layer DP-CL illustrated in FIG. 5A.

The signal lines SGL include the scan lines GL, data lines DL, a power line PL, and a control signal line CSL. The signal lines SGL may further include reset lines and light-emitting lines, but the reset lines and the light-emitting lines are not illustrated in FIG. 5B. A signal line extending in the second direction DR2 among the plurality of signal lines SGL may be defined as a row signal line, and a signal line extending in the first direction DR1 may be defined as a column signal line. The scan lines GL may be row signal lines, and the data lines DL may be column signal lines.

In some exemplary embodiments, the scan lines GL are respectively connected to a corresponding pixel PX of the pixels PX, and the data lines DL are respectively connected to a corresponding pixel PX of the pixels PX. The power line PL is connected to the pixels PX. The control signal line CSL may provide control signals to the scan driving circuit.

The signal lines SGL may be connected to a circuit board (not illustrated). The signal lines SGL may be connected to a timing control circuit (not shown) in the form of an integrated chip mounted on the circuit board. In some exemplary embodiments, the integrated chip may also be disposed in the third panel region DP-BA and connected to at least some of the signal lines SGL.

One pixel PX disposed in an n-th pixel row is illustrated in FIG. 5C. The pixel PX may include an organic light-emitting diode OLED and a pixel driving circuit CC. An n-th scan line GLn and an n-th reset line RLn are disposed to correspond to the one pixel PX.

The pixel driving circuit CC may include a plurality of transistors T1 to T7 and a capacitor CP. The pixel driving circuit CC controls the amount of current flowing in the organic light-emitting diode OLED in response to a data signal transmitted via the data line DL.

The organic light-emitting diode OLED may emit light having a predetermined luminance in response to the amount of current provided from the pixel driving circuit CC. To this end, a level of a first power source ELVDD may be set to be higher than a level of a second power source ELVSS.

The plurality of transistors T1 to T7 may each include an input electrode (or a source electrode), an output electrode (or a drain electrode), and a control electrode (or a gate electrode).

An input electrode of a first transistor T1 is connected to the first power source ELVDD via a fifth transistor T5, and an output electrode of the first transistor T1 is connected to a first electrode of the organic light-emitting diode OLED via a sixth transistor T6. The first transistor T1 controls the amount of current flowing in the organic light-emitting diode OLED in response to a voltage applied to a control electrode of the first transistor T1 that is connected to a reference node ND. The first transistor T1 may be defined as a driving transistor.

A second transistor T2 is connected between the data line DL and the input electrode of the first transistor T1. A control electrode of the second transistor T2 is connected to the n-th scan line GLn. The second transistor T2 is turned on by an n-th scan signal Sn applied to the n-th scan line GLn so as to electrically connect the data line DL and the input electrode of the first transistor T1.

A third transistor T3 is connected between the output electrode and the control electrode of the first transistor T1. A control electrode of the third transistor T3 is connected to the n-th scan line GLn. The third transistor T3 is turned on by the n-th scan signal Sn so as to electrically connect the output electrode and the control electrode of the first transistor T1. Accordingly, the first transistor T1 is connected in the form of a diode when the third transistor T3 is turned on.

A fourth transistor T4 is connected between a reference node ND and an initialization power-generating unit (not illustrated). A control electrode of the fourth transistor T4 is connected to the n-th reset line RLn. The fourth transistor T4 is turned on by an (n−1)-th scan signal Sn-1 applied to the n-th reset line RLn so as to provide an initialization voltage Vint to the reference node ND.

The fifth transistor T5 is connected between the power line PL and the input electrode of the first transistor T1. A control electrode of the fifth transistor T5 is connected to an n-th light emission control line ECLn.

The sixth transistor T6 is connected between the output electrode of the first transistor T1 and the first electrode of the organic light-emitting diode OLED. A control electrode of the sixth transistor T6 is connected to the n-th light emission control line ECLn.

A seventh transistor T7 is connected between the initialization power-generating unit and the first electrode of the organic light-emitting diode OLED. A control electrode of the seventh transistor T7 receives an (n+1)-th scan signal Sn+1. The control electrode of the seventh transistor T7 may be connected to an (n+1)-th scan line GLn+1. The seventh transistor T7 provides the initialization voltage Vint to the first electrode of the organic light-emitting diode OLED in response to the (n+1)-th scan signal Sn+1.

The seventh transistor T7 may improve a black display capability of the pixel PX. For instance, when the seventh transistor T7 is turned on, a parasitic capacitor (not illustrated) of the organic light-emitting diode OLED is discharged. As such, the organic light-emitting diode OLED will not emit light by a leakage current from the first transistor T1 when black luminance is implemented, and, thus, the black display capability may be improved.

The pixel PX is illustrated on the basis of p-channel metal-oxide-semiconductor (PMOS) transistors in FIG. 5C, but exemplary embodiments are not limited thereto. In some exemplary embodiments, the pixel PX may be constituted of n-channel MOS (NMOS) transistors. In some exemplary embodiments, the pixel PX may be constituted of a combination of NMOS and PMOS transistors.

The capacitor CP is disposed between the power line PL and the reference node ND. The capacitor CP stores a voltage corresponding to a data signal transmitted via the data line DL. The amount of current flowing in the first transistor T1 may be determined depending on the voltage stored in the capacitor CP when the fifth transistor T5 and the sixth transistor T6 are turned on.

It is noted, however, that the configuration of the pixel driving circuit CC is not limited to the circuit diagram illustrated in FIG. 5C. In some exemplary embodiments, the pixel driving circuit CC may be implemented in various configurations for emitting light in via the organic light-emitting diode OLED.

Referring to FIG. 5D, when an n-th light emission control signal En has a high level E-HIGH, the fifth transistor T5 and the sixth transistor T6 are turned off. When the fifth transistor T5 is turned off, the power line PL and the input electrode of the first transistor T1 are electrically disconnected. When the sixth transistor T6 is turned off, the output electrode of the first transistor T1 and the first electrode of the organic light-emitting diode OLED are electrically disconnected. Accordingly, while an n-th light emission control signal En having the high level E-HIGH is being provided via the n-th light emission control line ECLn, the organic light-emitting diode OLED does not emit light.

Thereafter, when the (n−1)-th scan signal Sn-1 has a low level S-LOW, the fourth transistor T4 is turned on. When the fourth transistor T4 is turned on, the initialization voltage Vint is provided to the reference node ND.

When the n-th scan signal Sn has a low level S-LOW, the second transistor T2 and the third transistor T3 are turned on. When the second transistor T2 is turned on, a data signal is provided to the input electrode of the first transistor T1. In this case, the first transistor T1 is turned on because the reference node ND is initialized at the initialization voltage Vint. When the first transistor T1 is turned on, a voltage corresponding to the data signal is provided to the reference node ND. At this time, the capacitor CP stores the voltage corresponding to the data signal.

When the (n+1)-th scan signal Sn+1 has a low level S-LOW, the seventh transistor T7 is turned on. When the seventh transistor T7 is turned on, the initialization voltage Vint is provided to the first electrode of the organic light-emitting diode OLED so that the parasitic capacitor (or capacitance) of the organic light-emitting diode OLED is discharged.

When the n-th light emission control signal En has a low level E-LOW, the fifth transistor T5 and the sixth transistor T6 are turned on. When the fifth transistor T5 is turned on, the first power source ELVDD is provided to the input electrode of the first transistor T1. When the sixth transistor T6 is turned on, the output electrode of the first transistor T1 and the first electrode of the organic light-emitting diode OLED are electrically connected. As such, the organic light-emitting diode OLED generates light of a predetermined luminance in response to the amount of supplied current.

Figure 6A:
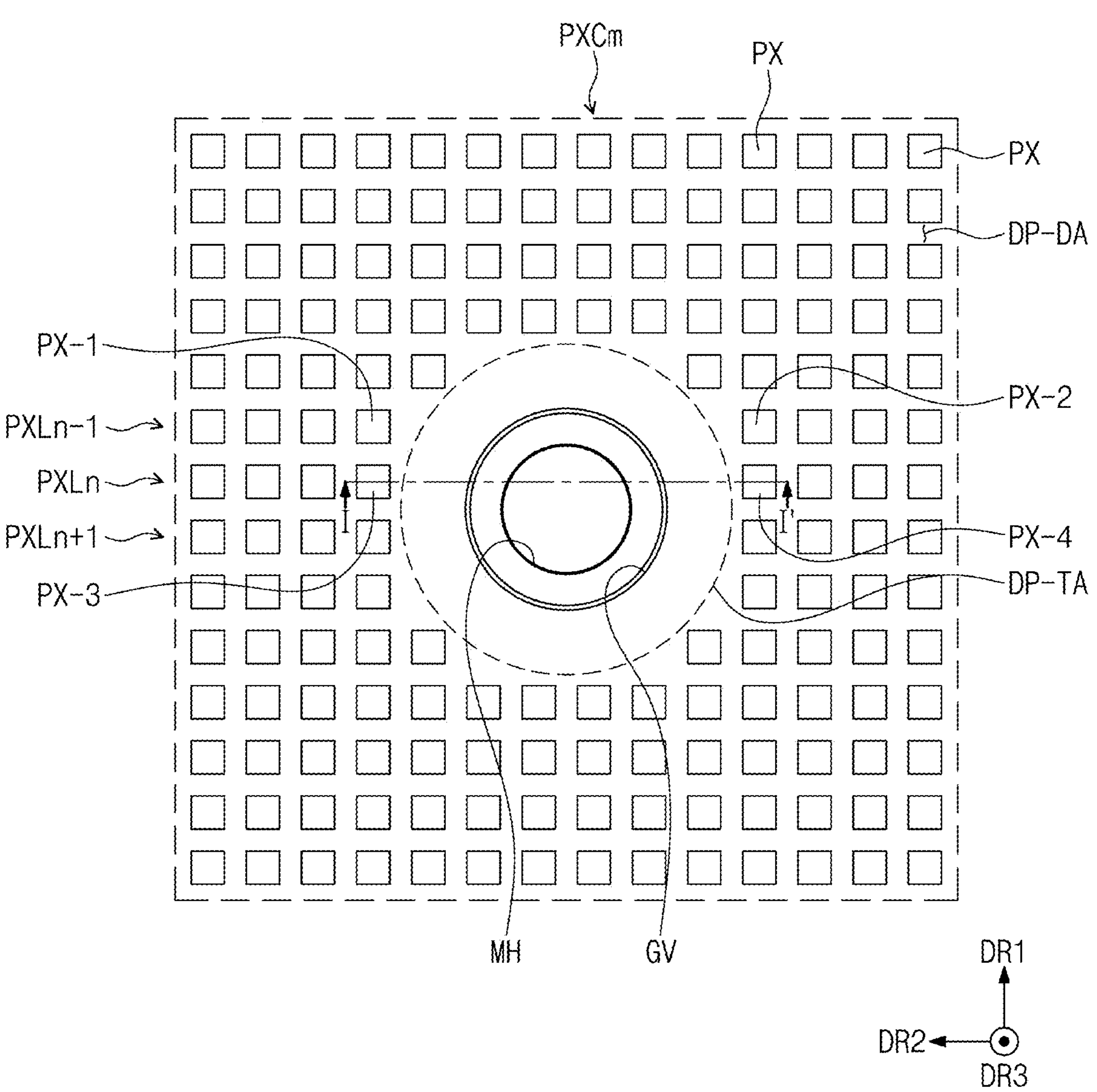
FIG. 6A is an enlarged plan view illustrating a portion of the display panel of FIG. 5B according to some exemplary embodiments.
Figure 6B:
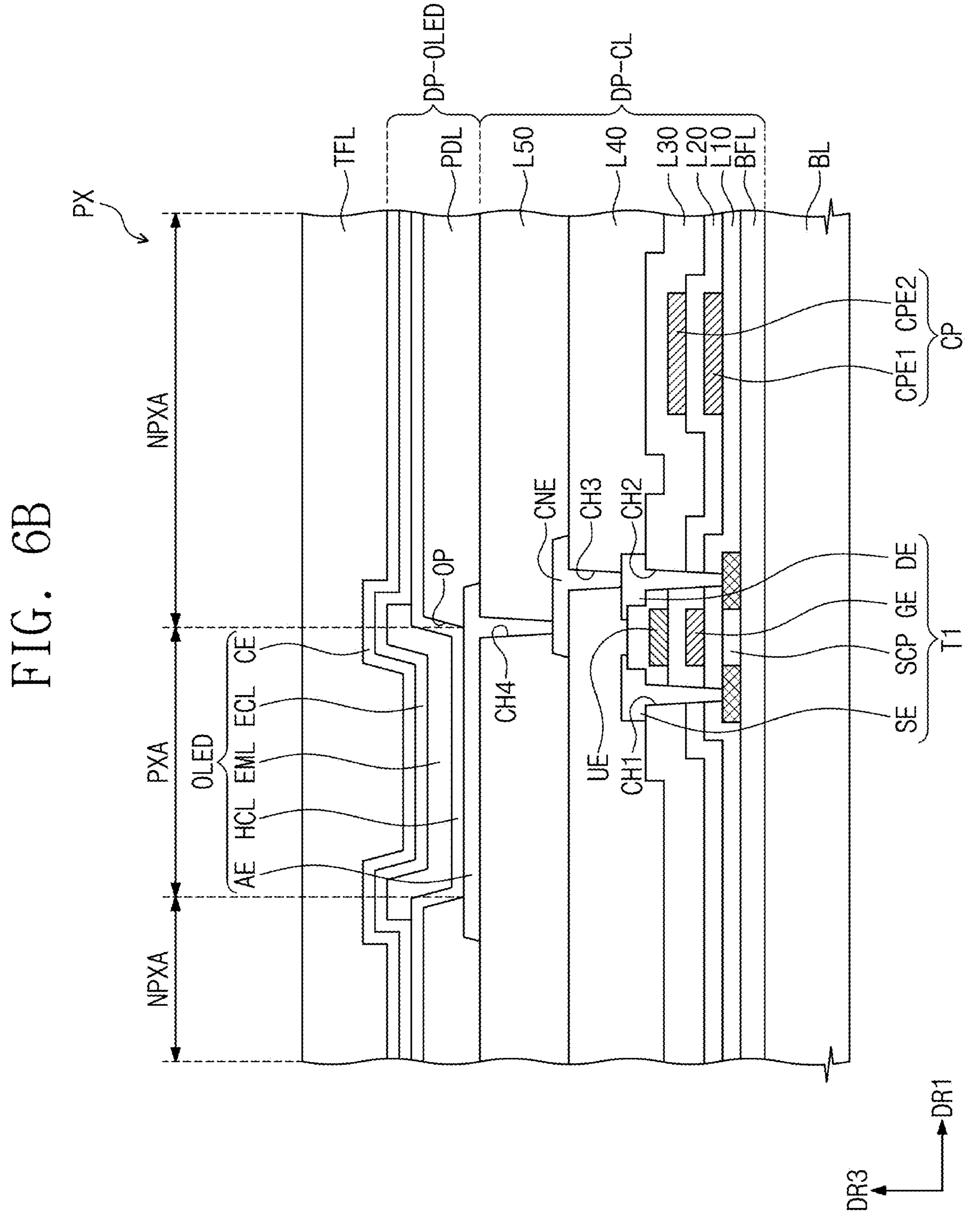
FIGS. 6B and 6C are cross-sectional views illustrating portions of the display panel of FIG. 6A according to some exemplary embodiments.
Figure 6C:
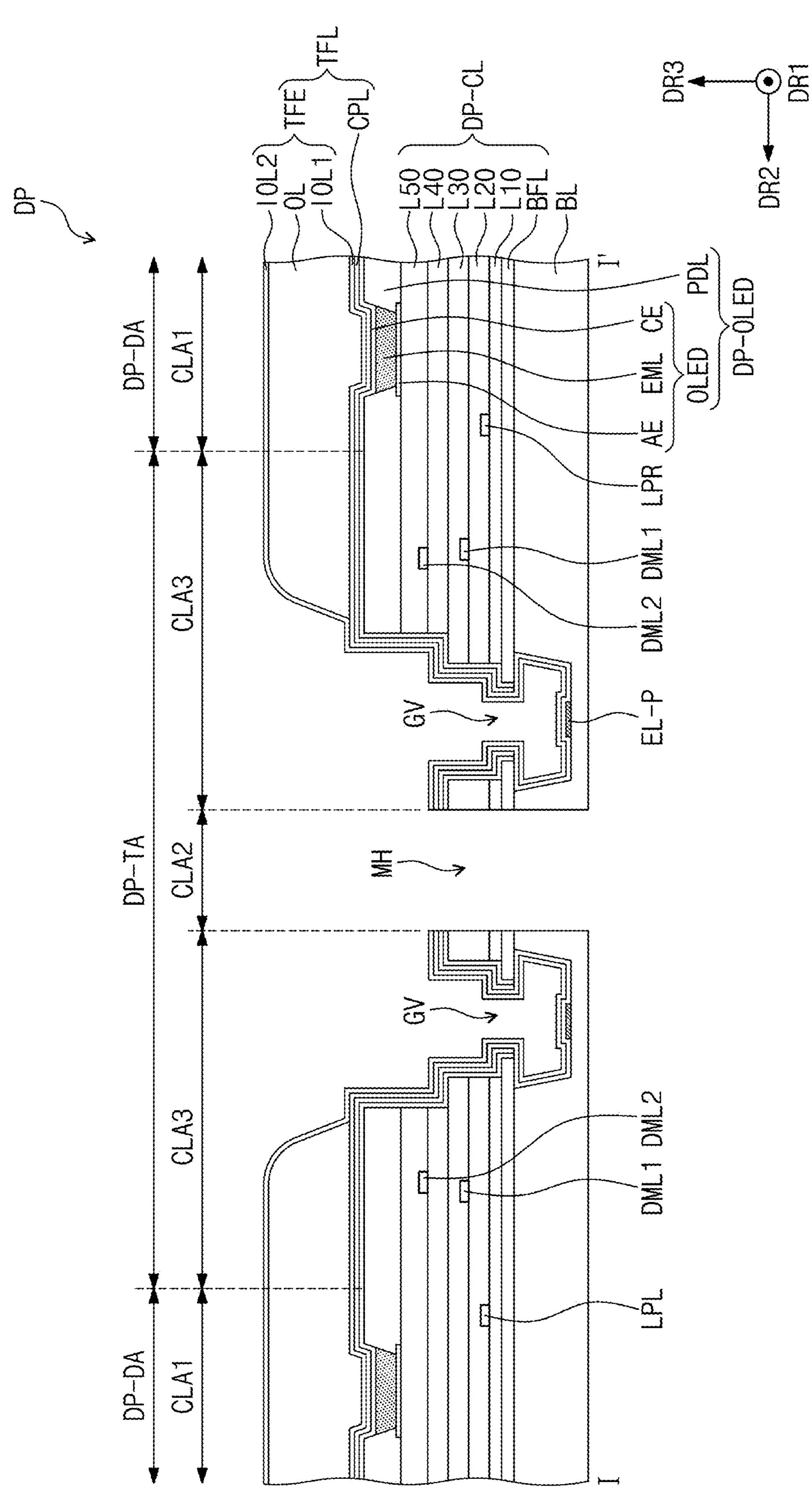
Figure 6D:
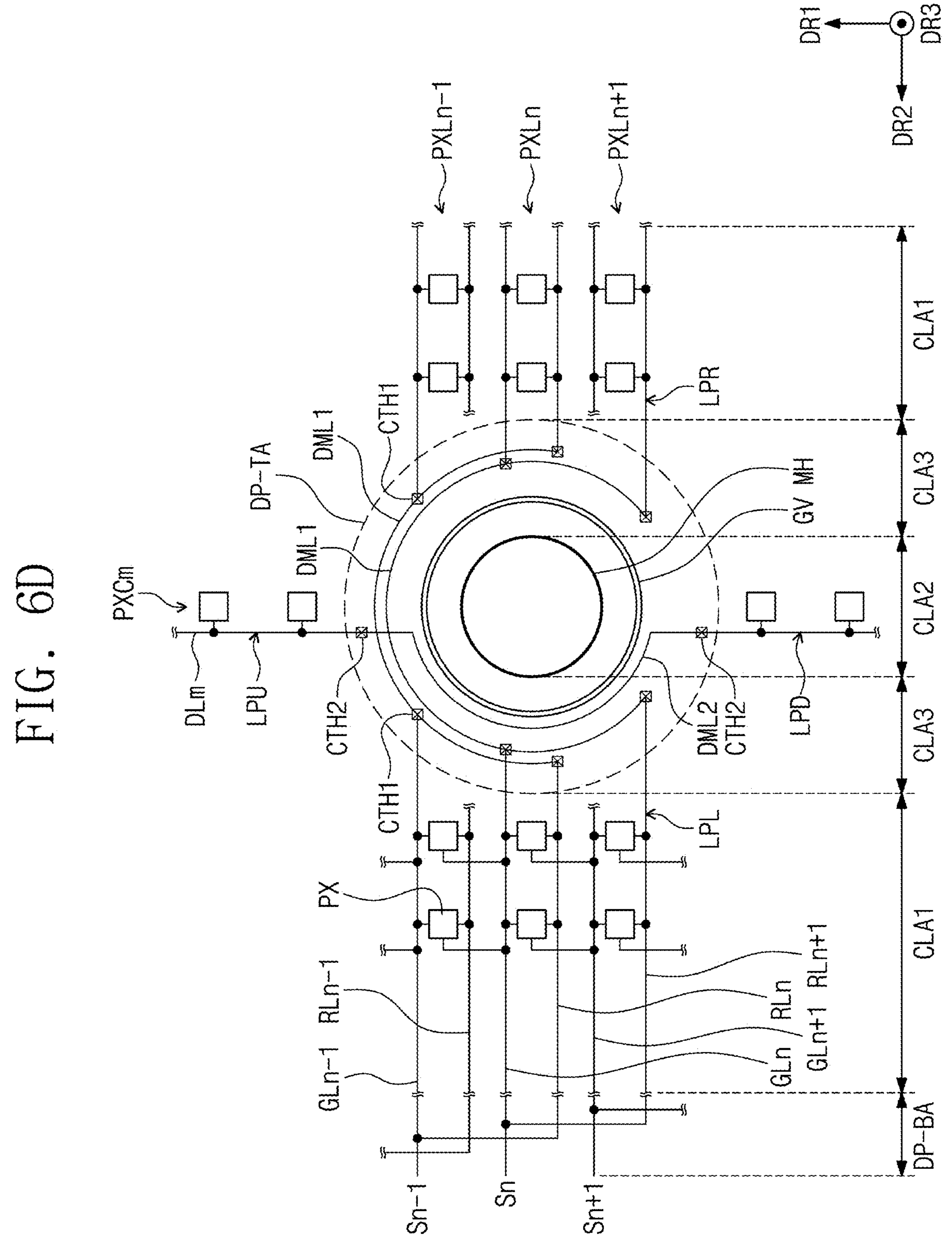
FIG. 6D is an enlarged plan view illustrating a portion of the display panel of FIG. 6A according to some exemplary embodiments.

FIG. 6A is an enlarged plan view illustrating a portion of the display panel of FIG. 5B according to some exemplary embodiments. FIGS. 6B and 6C are cross-sectional views illustrating portions of the display panel of FIG. 6A according to some exemplary embodiments. FIG. 6D is an enlarged plan view illustrating a portion of the display panel of FIG. 6A according to some exemplary embodiments.

FIG. 6A illustrates the second panel region DP-TA and the first panel region DP-DA on a periphery of the second panel region DP-TA. Some of a plurality of pixel rows are illustrated in FIG. 6A. An (n−1)-th pixel row PXLn−1, an n-th pixel row PXLn, and an (n+1)-th pixel row PXLn+1 are indicated among the plurality of pixel rows. A plurality of pixels PX may be divided into pixel columns, and an m-th pixel column PXCm is indicated.

Because the pixels PX are not arranged in the second panel region DP-TA, the (n−1)-th pixel row PXLn−1, the n-th pixel row PXLn, and the (n+1)-th pixel row PXLn+1 are divided in the second panel region DP-TA. More pixel rows are illustrated and divided by the second panel region DP-TA, except for the (n−1)-th pixel row PXLn−1, the n-th pixel row PXLn, and the (n+1)-th pixel row PXLn+1.

A first pixel PX-1, a second pixel PX-2 disposed in the same pixel row as the first pixel PX-1, a third pixel PX-3 disposed in a pixel row different from that of the first pixel PX-1, and a fourth pixel PX-4 disposed in the same pixel row as the third pixel PX-3 are disposed around the second panel region DP-TA. The first pixel PX-1, the second pixel PX-2, the third pixel PX-3, and the fourth pixel PX-4 are disposed outside the second panel region DP-TA.

Spacing between the first pixel PX-1 and the second pixel PX-2 in the (n−1)-th pixel row PXLn−1 is greater than the spacing between other pixels PX in the (n−1)-th pixel row PXLn−1. Spacing between the third pixel PX-3 and the fourth pixel PX-4 in the n-th pixel row PXLn is greater than the spacing between other pixels PX in the n-th pixel row PXLn.

The (n−1)-th pixel row PXLn−1 may include a red pixel and a blue pixel alternately disposed in the second direction DR2. The n-th pixel row PXLn may include a green pixel. One group of odd-numbered pixel rows and even-numbered pixel rows may have the same pixel arrangement as the (n−1)-th pixel row PXLn−1, and the other group of the odd-numbered pixel rows and the even-numbered pixel rows may have the same pixel arrangement as the n-th pixel row PXLn. At least one of the areas of light-emitting regions PXA (see FIG. 6B) of the red pixel, the blue pixel, and the green pixel may be different from each other.

Pixels PX of pixel columns are illustrated to be aligned in a line in the first direction DR1, but exemplary embodiments are not limited thereto. The pixels PX of the pixel columns may be arranged in a zigzag manner in the first direction DR1. Pixels PX of the odd-numbered pixel rows may be arranged between pixels PX of the even-numbered pixel rows. It suffices that pixels included in one pixel column are connected to the same data line.

FIG. 6B illustrates a cross-section of a pixel PX including a driving transistor T1 and an organic light-emitting diode OLED.

The base layer BL may include a synthetic resin layer. The synthetic resin layer is formed on a support substrate used in manufacturing the display panel DP. Thereafter, a conductive layer, an insulating layer, and the like are formed on the synthetic resin layer. When the support substrate is removed, the synthetic resin layer corresponds to the base layer BL.

In some exemplary embodiments, the circuit element layer DP-CL may include a buffer film BFL, a first intermediate inorganic layer L10, a second intermediate inorganic layer L20, and a third intermediate inorganic layer L30 that are inorganic layers, and a first intermediate organic layer L40, and a second intermediate organic layer L50 that are organic layers. A disposition relation is exemplarily illustrated of a semiconductor pattern SCP, a control electrode GE, an input electrode SE, and an output electrode DE that constitute the driving transistor T1. First to fourth through-holes CH1 to CH4 are also illustrated by way of example. The input electrode SE and the output electrode DE are connected to the semiconductor pattern SCP through the first through-hole CH1 and the second through-hole CH2.

As in the case of the control electrode GE, a first capacitor electrode CPE1 of the capacitor CP is disposed on the first intermediate inorganic layer L10. A second capacitor electrode CPE2 of the capacitor CP is disposed on the second intermediate inorganic layer L20. An upper electrode UE overlapping the control electrode GE is disposed on the second intermediate inorganic layer L20. The second capacitor electrode CPE2 and the upper electrode UE may be electrically connected. The second capacitor electrode CPE2 and the upper electrode UE may be different portions of one conductive pattern.

A connection electrode CNE disposed on the first intermediate organic layer L40 is connected to the output electrode DE through the third through-hole CH3. A first electrode AE disposed on the second intermediate organic layer L50 is connected to the connection electrode CNE through the fourth through-hole CH4.

The display element layer DP-OLED may include the organic light-emitting diode OLED and a pixel-defining film (or layer) PDL. The pixel-defining film PDL may be an organic layer.

The first electrode AE is disposed on the second intermediate organic layer L50. A light-emitting opening OP is defined in the pixel-defining film PDL. The light-emitting opening OP of the pixel-defining film PDL exposes at least a portion of the first electrode AE.

The first panel region DP-DA may include a light-emitting region PXA and a non-light-emitting region NPXA adjacent to the light-emitting region PXA. The non-light-emitting region NPXA may surround the light-emitting region PXA. In some exemplary embodiments, the light-emitting region PXA is defined to correspond to the portion of the first electrode AE exposed by the light-emitting opening OP.

A hole control layer HCL may be disposed in both the light-emitting region PXA and the non-light-emitting region NPXA. The hole control layer HCL may include a hole transport layer, and may further include a hole injection layer. A light-emitting layer EML is disposed on the hole control layer HCL. The light-emitting layer EML may be disposed in a region corresponding to the light-emitting opening OP. In some exemplary embodiments, the light-emitting layer EML may be separately formed in each of the pixels, but exemplary embodiments are not limited thereto. The light-emitting layer EML may include an organic material and/or an inorganic material. The light-emitting layer EML may generate one or more predetermined colors of light.

An electron control layer ECL is disposed on the light-emitting layer EML. The electron control layer ECL may include an electron transport layer, and may further include an electron injection layer. The hole control layer HCL and the electron control layer ECL may be formed using an open mask in the whole of a plurality of pixels PX. A second electrode CE is disposed on the electron control layer ECL. The second electrode CE is disposed on the whole of the plurality of pixels PX.

The upper insulating layer TFL is disposed on the second electrode CE. The upper insulating layer TFL may include a plurality of thin films, such as at least one inorganic film and at least one organic film.

FIG. 6C illustrates a cross section taken along sectional line I-I' of FIG. 6A according to some exemplary embodiments. In FIG. 6C, the organic light-emitting diode OLED is schematically illustrated, and the driving transistor T1 and the capacitor CP of FIG. 6B are not illustrated for convenience.

The upper insulating layer TFL is specifically illustrated. In some exemplary embodiments, the upper insulating layer TFL may include a capping layer CPL and a thin film encapsulation layer TFE. The thin film encapsulation layer TFE may include a first inorganic layer IOL1, an organic layer OL, and a second inorganic layer IOL2.

The capping layer CPL is disposed on and comes into contact with the second electrode CE. The capping layer CPL may include organic material. The first inorganic layer IOL1 is disposed on and comes into contact with the capping layer CPL. The organic layer OL is disposed on and comes into contact with the first inorganic layer IOL1. The second inorganic layer IOL2 is disposed on and comes into contact with the organic layer OL.

The capping layer CPL protects the second electrode CE from a subsequent process, for example, a sputtering process, and enhances light emission efficiency of the organic light-emitting diode OLED. The capping layer CPL may have a larger refractive index than the first inorganic layer IOL1.

The first inorganic layer IOL1 and the second inorganic layer IOL2 protect the display element layer DP-OLED from contaminants, e.g., water, oxygen, etc. (hereinafter referred to as water/oxygen), and the organic layer OL protects the display element layer DP-OLED from foreign matter, such as dust particles. The first inorganic layer IOL1 and the second inorganic layer IOL2 may be at least one of a silicon nitride layer, a silicon oxynitride layer, and a silicon oxide layer. In some exemplary embodiments, the first inorganic layer IOL1 and the second inorganic layer IOL2 may include a titanium oxide layer, an aluminum oxide layer, and/or the like. The organic layer OL may include, but is not limited to, an acrylic organic layer.

According to some exemplary embodiments, an inorganic layer, for example, an lithium fluoride (LiF) layer (not shown) may be further disposed between the capping layer CPL and the first inorganic layer IOL1. The LiF layer may improve light emission efficiency of the organic light-emitting diode OLED.

In some exemplary embodiments, referring to FIG. 6C, a module hole MH may be defined inside the second panel region DP-TA. In other words, an opening defined from a bottom surface of the display panel DP to a top surface of the display panel DP corresponds to the module hole MH. In some exemplary embodiments, a bottom surface of the base layer BL corresponds to the bottom surface of the display panel DP, and a top surface of the second inorganic layer IOL2 corresponds to the top surface of the display panel DP.

A recess pattern GV may be disposed around the module hole MH. Unlike the module hole MH, the recess pattern GV does not penetrate completely through the display panel DP. The recess pattern GV may be defined along the edge of the module hole MH. In some exemplary embodiments, the recess pattern GV is illustrated as a closed line surrounding the module hole MH, and illustrated as a circular shape similar to that of the module hole MH. However, this is illustrated by way of example. The recess pattern GV may have a shape different from that of the module hole MH, may have a shape of a polygon, an ellipse, or a closed line including a curved line at least partially, or may also be provided in a shape including a plurality of partially disconnected patterns, but exemplary embodiments are not limited thereto.

The recess pattern GV penetrates the circuit element layer DP-CL to extend to a groove formed in the base layer BL. A deposition pattern EL-P may be disposed inside the recess pattern GV. The deposition pattern EL-P is formed by depositing deposition material on the groove of the base layer BL in a deposition process of the organic light-emitting diode OLED.

The deposition pattern EL-P may include a layer having material the same as that of the light-emitting layer EML, and a layer having material the same as that of the second electrode CE. The deposition pattern EL-P may further include a layer having material the same as that of the hole control layer HCL, and a layer having material the same as that of the electron control layer ECL.

A portion of each of the first inorganic layer IOL1 and the second inorganic layer IOL2 covering the deposition pattern EL-P may be disposed inside the recess pattern GV. The first inorganic layer IOL1 and the second inorganic layer IOL2 may cover an inner surface of the recess pattern GV.

The recess pattern GV may have an undercut shape. The recess pattern GV is narrower at an entrance than at the inside when viewed in a cross-sectional view. The first intermediate organic layer L40 and the second intermediate organic layer L50 are sealed by (or from) the recess pattern GV. The recess pattern GV may block moisture or air that may flow into the organic light-emitting diode OLED, the first intermediate organic layer L40, and/or the second intermediate organic layer L50.

Each of the base layer BL, the circuit element layer DP-CL, the display element layer DP-OLED, and the upper insulating layer TFL may include a plurality of regions. For example, each of the base layer BL, the circuit element layer DP-CL, the display element layer DP-OLED, and the upper insulating layer TFL may include first to fourth regions. A first region CLA1, a second region CLA2, and a third region CLA3 of the circuit element layer DP-CL are shown in FIG. 6C.

The first region CLA1 is a region in which a signal line (to be described later) and the pixel driving circuit CC are disposed, and may correspond to the first panel region DP-DA. The second region CLA2 corresponds to the second panel region DP-TA, and may be a region in which the signal line and the pixel driving circuit CC are not disposed. According to some exemplary embodiments, the second region CLA2 may be an opening corresponding to the module hole MH.

The third region CLA3 corresponds to the second panel region DP-TA, and is disposed around the second region CLA2. The signal line may be disposed in the third region CLA3. The signal line may include a first connection line DML1 and a second connection line DML2 to be described later. The pixel driving circuit CC may not be disposed in the third region CLA3. In some exemplary embodiments, the recess pattern GV is formed in the third region CLA3.

Although not illustrated in FIG. 6C, a fourth region of the circuit element layer DP-CL may be a region corresponding to the third panel region DP-BA illustrated in FIG. 5B. A scan driving circuit GDC is disposed in the fourth region of the circuit element layer DP-CL.

FIG. 6D illustrates only the (n−1)-th pixel row PXLn−1, the n-th pixel row PXLn, the (n+1)-th pixel row PXLn+1, and the m-th pixel column PXCm of FIG. 6A. Additionally illustrated are scan lines GLn−1, GLn, and GLn+1 respectively corresponding to the (n−1)-th pixel row PXLn−1, the n-th pixel row PXLn, and the (n+1)-th pixel row PXLn+1, and reset lines RLn−1, RLn, and RLn+1 respectively corresponding to the (n−1)-th pixel row PXLn−1, the n-th pixel row PXLn, and the (n+1)-th pixel row PXLn+1. Additionally, an m-th data line DLm connected to the m-th pixel column PXCm is illustrated.

For the purposes of this disclosure, a description that a pixel row/column is connected to a signal line has the same meaning as a description that a pixel driving circuit of a pixel included in the pixel row/column is connected to the signal line. Here, "n" and "m" are natural numbers of greater than or equal to two. At least because a connection relation between a pixel and a scan line, a reset line, and a data line corresponding to the pixel is described with reference to FIG. 5C, a detailed description will not be given in association with FIG. 6D.

A reset line of a given pixel row may receive the same signal as a scan line of an immediately preceding pixel row. A reset line of a given pixel row may be connected to a scan line of an immediately preceding pixel row in the third panel region DP-BA. For instance, the n-th reset line RLn may receive the same signal as an (n−1)-th scan line GLn−1, e.g., the (n−1)-th scan signal Sn-1.

Pixels PX of a given pixel row may receive a scan signal from a scan line of an immediately following pixel row. A connection relation between the seventh transistor T7 and the (n+1)-th scan line GLn+1 illustrated in FIG. 5C is schematically illustrated in FIG. 6D.

Referring to FIG. 6D, the connection lines are disposed in the third region CLA3. The first connection line DML1 connects a reset line of a given pixel row and a scan line of an immediately preceding pixel row. The first connection line DML1 may be defined as a row connection line. Illustrated in FIG. 6D are the first connection line DML1 for connecting the (n−1)-th scan line GLn−1 to the n-th reset line RLn, and the first connection line DML1 for connecting the n-th scan line GLn to an (n+1)-th reset line RLn+1 among a plurality of the first connection lines.

The scan lines GLn−1, GLn, and GLn+1, and the reset lines RLn−1, RLn, and RLn+1 may be disposed on the same layer as the control electrode GE illustrated in FIG. 6B. The first connection line DML1 may be disposed on a layer different from that of the scan lines GLn−1, GLn, and GLn+1 and the reset lines RLn−1, RLn, and RLn+1. In some exemplary embodiments, the first connection line DML1 may be disposed on the same layer as the upper electrode UE illustrated in FIG. 6B. A corresponding reset line or scan line is connected to the first connection line DML1 through first contact holes CTH1 penetrating the second intermediate inorganic layer L20.

Each of the scan lines GLn−1, GLn, and GLn+1 and the reset lines RLn−1, RLn, and RLn+1 may include a one-side line portion LPL and another-side line portion LPR spaced apart by opposite sides of the second panel region DP-TA. The one-side line portion LPL is connected to one-side pixels PX of a given pixel row, and the another-side line portion LPR is connected to the another-side pixels PX of the given pixel row.

The first connection line DML1 connects a one-side line portion LPL and the another-side line portion LPR of a reset line of a given pixel row. Additionally, the first connection line DML1 connects a one-side line portion LPL and the another-side line portion LPR of a scan line of an immediately preceding pixel row.

The first connection line DML1 may reduce the number of the signal lines arranged in the third region CLA3. As the area of the third region CLA3 decreases, the area of the non-display region NDA may be reduced. Additionally, by disposing the first connection line DML1 on a layer different from that of the scan lines GLn−1, GLn, and GLn+1 and the reset lines RLn−1, RLn, and RLn+1, a signal line open failure due to static electricity may be prevented or at least reduced.

In some exemplary embodiments, the reset line and the scan line are described as the signal lines connected to the first connection line DML1, but the signal lines are not limited thereto. As in the case of the first pixel PX-1, the second pixel PX-2, the third pixel PX-3, and the fourth pixel PX-4 illustrated in FIG. 6A, the first connection line DML1 may be applied to transmit the same signal to a plurality of pixel rows. The first connection line DML1 connects a first signal line connected to the first pixel PX-1, a second signal line connected to the second pixel PX-2, a third signal line connected to the third pixel PX-3, and a fourth signal line connected to the fourth pixel PX-4.

For pixels of the same pixel row, such as the first pixel PX-1 and the second pixel PX-2, a signal transmitted via the first connection line DML1 is applied to transistors corresponding to each other of the pixel driving circuits CC (see, e.g., FIG. 5C). For pixels of pixel rows different from each other, such as the first pixel PX-1 and the third pixel PX-3, a signal transmitted via the first connection line DML1 may be applied to transistors different from each other of the pixel driving circuits CC.

The m-th data line DLm may be disposed on the same layer as the input electrode SE and the output electrode DE illustrated in FIG. 6B. The second connection line DML2 may be disposed on the same layer as the connection electrode CNE illustrated in FIG. 6B. A corresponding m-th data line DLm is connected to the second connection line DML2 via second contact holes CTH2 penetrating the first intermediate organic layer L40. The second connection line DML2 may be defined as a column connection line. The second connection line DML2 may also be considered as a portion of the m-th data line DLm.

The m-th data line DLm may include a one-side line portion LPU and another-side line portion LPD spaced apart by opposite sides of the second panel region DP-TA. The one-side line portion LPU is connected to one-side pixels PX of a given pixel column, and the anther-side line portion LPD is connected to another-side pixels PX of the given pixel column.

The second connection line DML2 may connect the one-side line portion LPU and the another-side line portion LPD of the m-th data line DLm. By disposing the second connection line DML2 on a layer different from that of the m-th data line DLm, a signal line open failure due to static electricity may be prevented or at least reduced.

Although not illustrated separately, the module hole MH may not be formed in some exemplary embodiments. For example, the module hole MH may not be formed in the base layer BL. One or more of the insulating layers of the circuit element layer DP-CL may be disposed in the second region CLA2. However, by not disposing conductive patterns of the circuit element layer DP-CL in the second region CLA2, or by not disposing a part or the whole of the display element layer DP-OLED in the second region CLA2, a portion of the display panel DP corresponding to the second region CLA2 may have greater light transmittance than other portions of the display panel DP corresponding to the first region CLA1 and the third region CLA3.

Figure 7A:
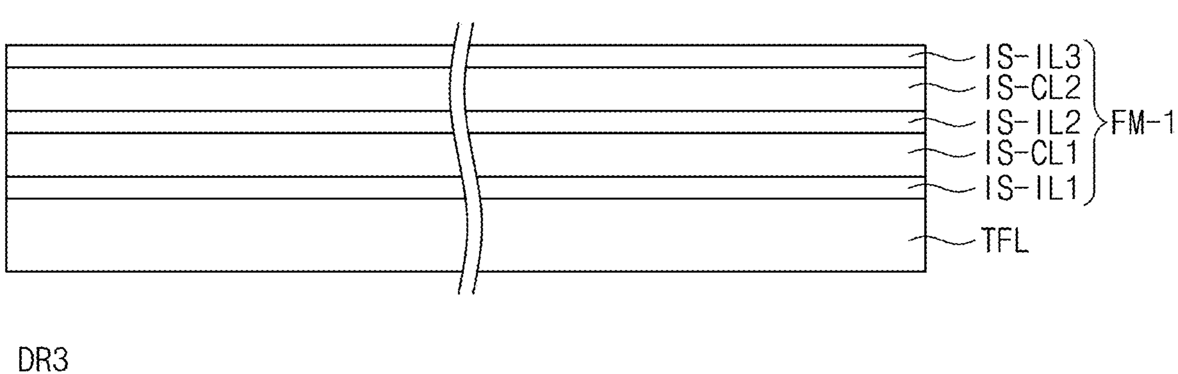
FIG. 7A is a cross-sectional view illustrating an input sensor according to some exemplary embodiments.
Figure 7B:
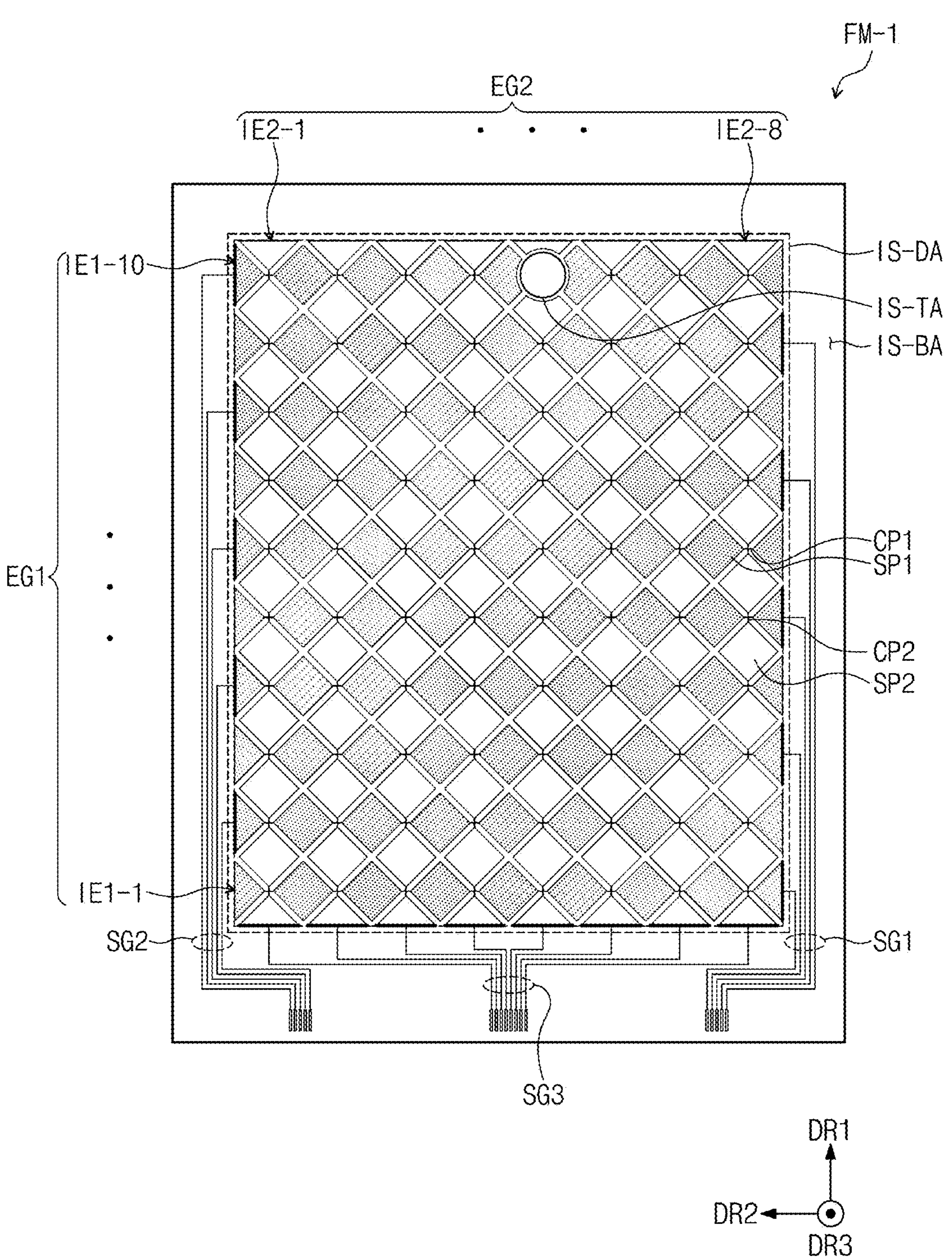
FIG. 7B is a plan view illustrating the input sensor of FIG. 7A according to some exemplary embodiments.
Figure 7C:
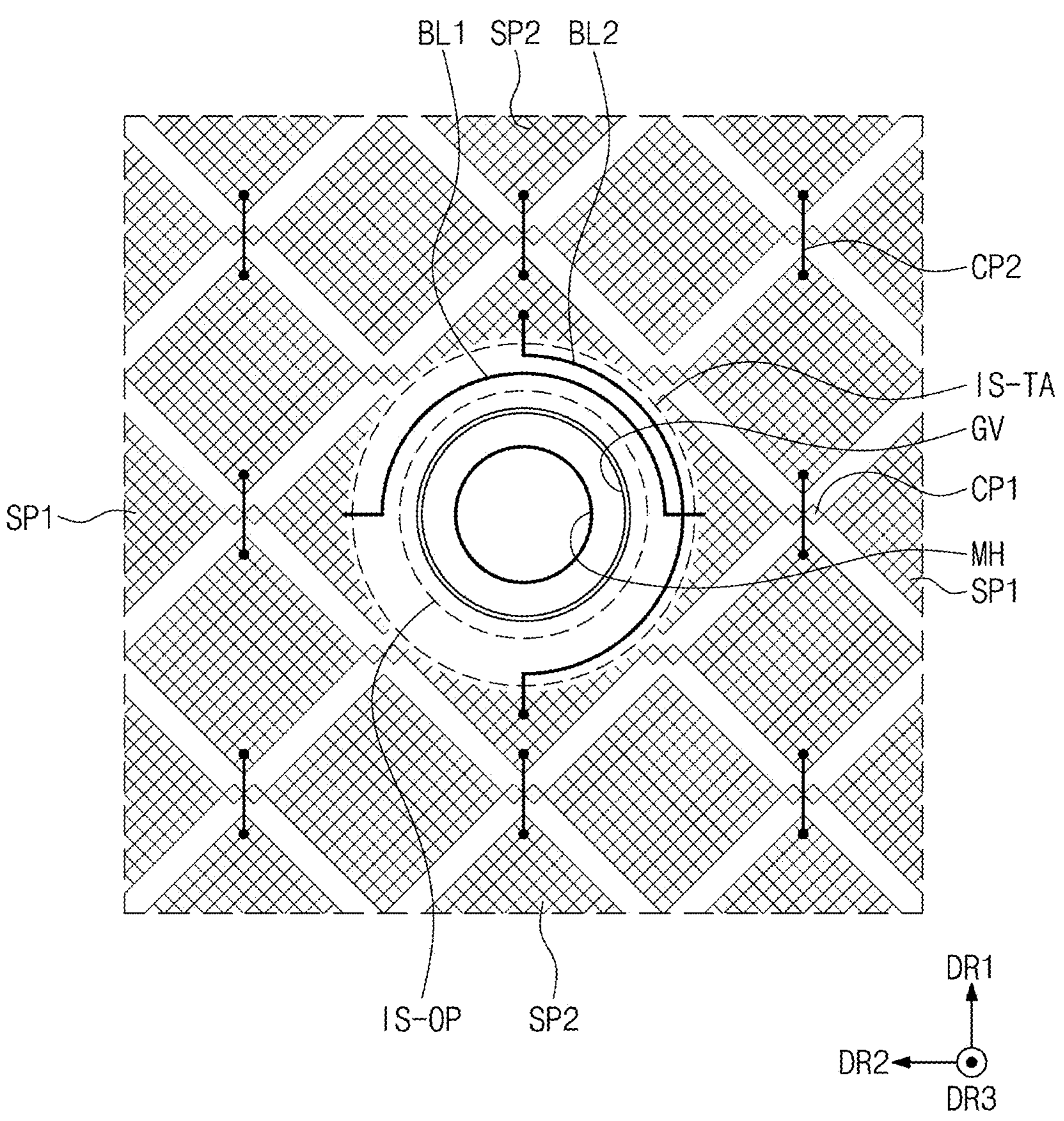
FIG. 7C is a partial plan view illustrating a portion of the input sensor of FIG. 7B according to some exemplary embodiments.

FIG. 7A is a cross-sectional view illustrating an input sensor according to some exemplary embodiments. FIG. 7B is a plan view illustrating the input sensor of FIG. 7A according to some exemplary embodiments. FIG. 7C is a partial plan view illustrating a portion of the input sensor of FIG. 7B according to some exemplary embodiments. The upper insulating layer TFL providing a base surface is schematically illustrated in FIG. 7A.

As illustrated in FIG. 7A, the input sensor FM-1 may include a first insulating layer IS-IL1, a first conductive layer IS-CL1, a second insulating layer IS-IL2, a second conductive layer IS-CL2, and a third insulating layer IS-IL3. The first insulating layer IS-IL1 may be disposed directly on the upper insulating layer TFL. The first insulating layer IS-IL1 may be omitted in some exemplary embodiments.

Each of the first conductive layer IS-CL1 and the second conductive layer IS-CL2 may have a single layer structure or a multi-layer structure laminated in a third direction DR3. A conductive layer of a multi-layer structure may include at least two of transparent conductive layers and metal layers. The conductive layer of a multi-layer structure may include metal layers having metals different from each other. A transparent conductive layer may include at least one of indium tin oxide (ITO), indium zinc oxide (IZO), zinc oxide (ZnO), indium tin zinc oxide (ITZO), poly(3,4-ethylenedioxythiophene) (PEDOT), metal nanowire, and graphene. A metal layer may include at least one of include molybdenum, silver, titanium, copper, aluminum, and alloys thereof. For example, the first conductive layer IS-CL1 and the second conductive layer IS-CL2 may each have a metal layer structure of three layers, for example, a three layer structure of titanium/aluminum/titanium.

Each of the first conductive layer IS-CL1 and the second conductive layer IS-CL2 includes a plurality of conductive patterns. Hereinafter, the first conductive layer IS-CL1 is described to include first conductive patterns, and the second conductive layer IS-CL2 is described to include second conductive patterns. Each of the first conductive patterns and the second conductive patterns may include sensing electrodes and signal lines connected to the sensing electrodes. The sensing electrodes may be opaque electrodes having a mesh shape that does not overlaps the non-light-emitting region NPXA and does not overlap the light-emitting region PXA, such as illustrated in FIG. 6B. The sensing electrodes may also be transparent electrodes overlapping the light-emitting region PXA and the non-light-emitting region NPXA.

Each of the first insulating layer IS-IL1, the second insulating layer IS-IL2, and the third insulating layer IS-IL3 may include inorganic material or organic material. In some exemplary embodiments, the first insulating layer IS-IL1 and the second insulating layer IS-IL2 may be an inorganic layer having inorganic material. The inorganic layer may include at least one of aluminum oxide, titanium oxide, silicon oxide, silicon oxynitride, zirconium oxide, and hafnium oxide. The third insulating layer IS-IL3 may include an organic layer. The organic layer may include at least one of acrylic resin, methacrylic resin, polyisoprene resin, vinyl resin, epoxy resin, urethane resin, cellulose resin, siloxane resin, polyimide resin, polyamide resin, and perylene resin.

As illustrated in FIG. 7B, the input sensor FM-1 may include a sensing region IS-DA, a first non-sensing region IS-TA, and a second non-sensing region IS-BA corresponding respectively to the first panel region DP-DA, the second panel region DP-TA, and the third panel region DP-BA of FIG. 5B.

As illustrated in FIG. 7B, the input sensor FM-1 may include a first electrode group EG1, a second electrode group EG2, a first signal line group SG1 connected to a part of the first electrode group EG1, a second signal line group SG2 connected to another part of the first electrode group EG1, and a third signal line group SG3 connected to the second electrode group EG2.

The first electrode group EG1 and the second electrode group EG2 cross each other. The first electrode group EG1 including ten first sensing electrodes IE1-1 to IE1-10, and the second electrode group EG2 including eight second sensing electrodes IE2-1 to IE2-8 are illustrated by way of example. An external input may be sensed in a mutual capacitive method and/or a self-capacitive method. Coordinates of an external input are calculated (or otherwise determined) in the mutual capacitive method during a first period of time, and then the coordinates of the external input may be re-calculated (or otherwise determined) in the self-capacitive method during a second period of time.

Each of the first sensing electrodes of the first electrode group EG1 includes a plurality of first sensors SP1 and a plurality of first connectors CP1. Each of the second sensing electrodes of the second electrode group EG2 includes a plurality of second sensors SP2 and a plurality of second connectors CP2. The shape of the electrodes of the first electrode group EG1 and the second electrode group EG2 is not particularly limited.

The first connectors CP1 may be formed from the first conductive layer IS-CL1. The first sensors SP1, the second sensors SP2, and the second connectors CP2 may be formed from the second conductive layer IS-CL2. The first connectors CP1 may be electrically connected to the first sensors SP1 via connection contact holes penetrating the second insulating layer IS-IL2.

Conductive patterns disposed on the same layer may be formed through the same process, may include the same material, and may have the same laminated structure. A laminating sequence of elements of the input sensor FM-1 described herein may be changed. In some exemplary embodiments, the first sensors SP1 and the second connectors CP2 may be disposed directly on the first insulating layer IS-IL1. The second insulating layer IS-IL2 covering the first sensors SP1 and the second connectors CP2 may be disposed on the first insulating layer IS-IL1. The first connectors CP1 disposed on the second insulating layer IS-IL2 may be electrically connected to the first sensors SP1 via the connection contact holes penetrating the second insulating layer IS-IL2. The input sensor FM-1 of a two-layer structure will be described as an example, but the input sensor FM-1 may be changed to a single layer structure that is driven in the self-capacitive method.

As illustrated in FIG. 7C, the first sensors SP1 and the second sensors SP2 may have a mesh shape. Some of the first sensing electrodes IE1-1 to IE1-10 and some of the second sensing electrodes IE2-1 to IE2-8 may be divided about the first non-sensing region IS-TA.

Two divided groups of the first sensors SP1 may be connected via a first bridge line BL1. The first bridge line BL1 may be formed from the second conductive layer IS-CL2 of FIG. 7A. In some exemplary embodiments, the first bridge line BL1 may also be formed by adding a separate process. Two divided groups of the second sensors SP2 may be connected via a second bridge line BL2. The second bridge line BL2 may be formed from the first conductive layer IS-CL1 of FIG. 7A. In some exemplary embodiments, the second bridge line BL2 may also be formed by adding a separate process.

The first bridge line BL1 and the second bridge line BL2 may be formed in a region corresponding to the third region CLA3 of FIG. 6C. A portion of the first non-sensing region IS-TA may correspond to an opening IS-OP of the input sensor FM-1. The opening IS-OP of the input sensor FM-1 may have a larger area than the module hole MH, as illustrated in FIG. 7C.

Figure 8A:
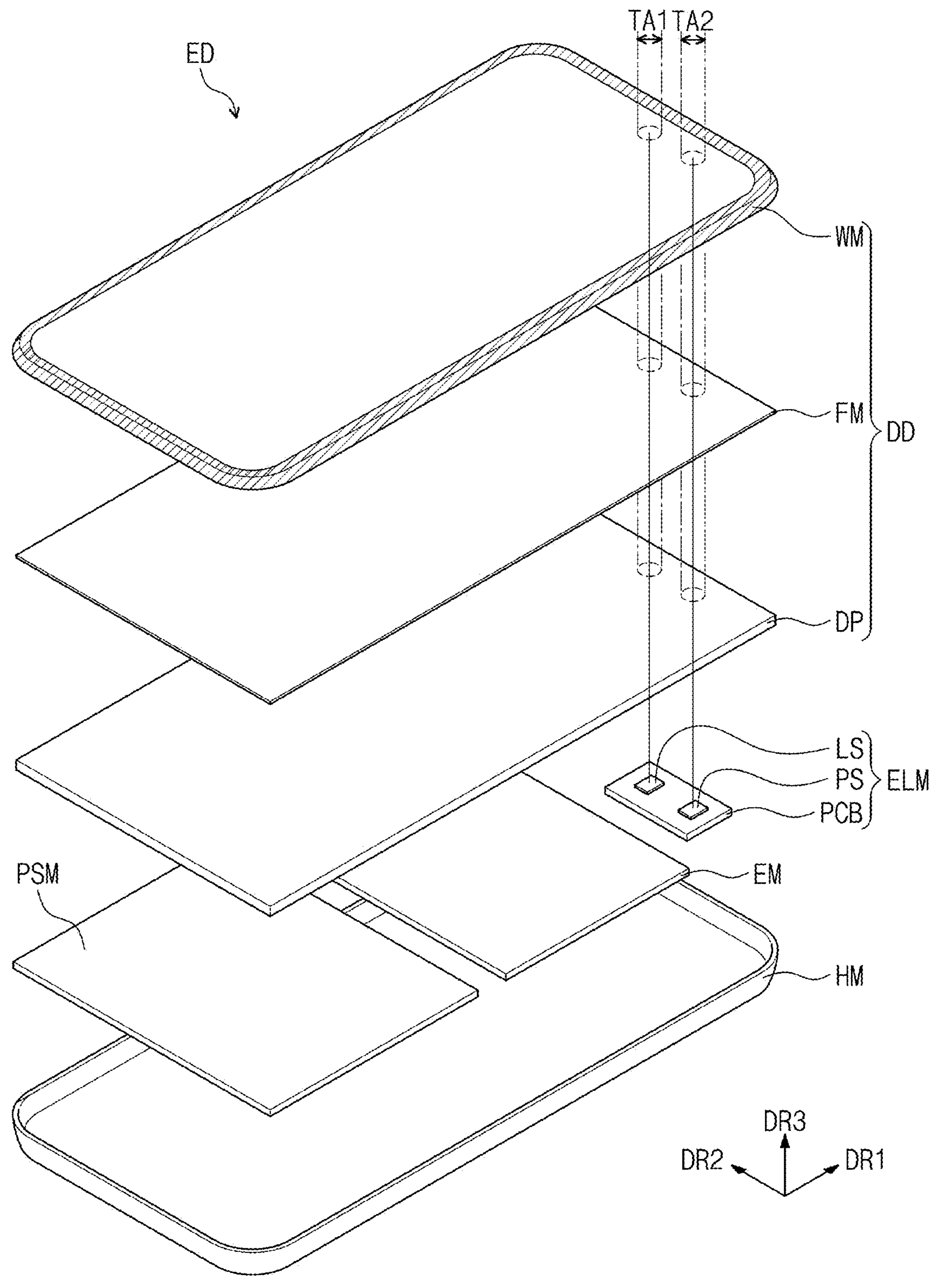
FIG. 8A is an exploded perspective view illustrating an electronic device according to some exemplary embodiments.
Figure 8B:
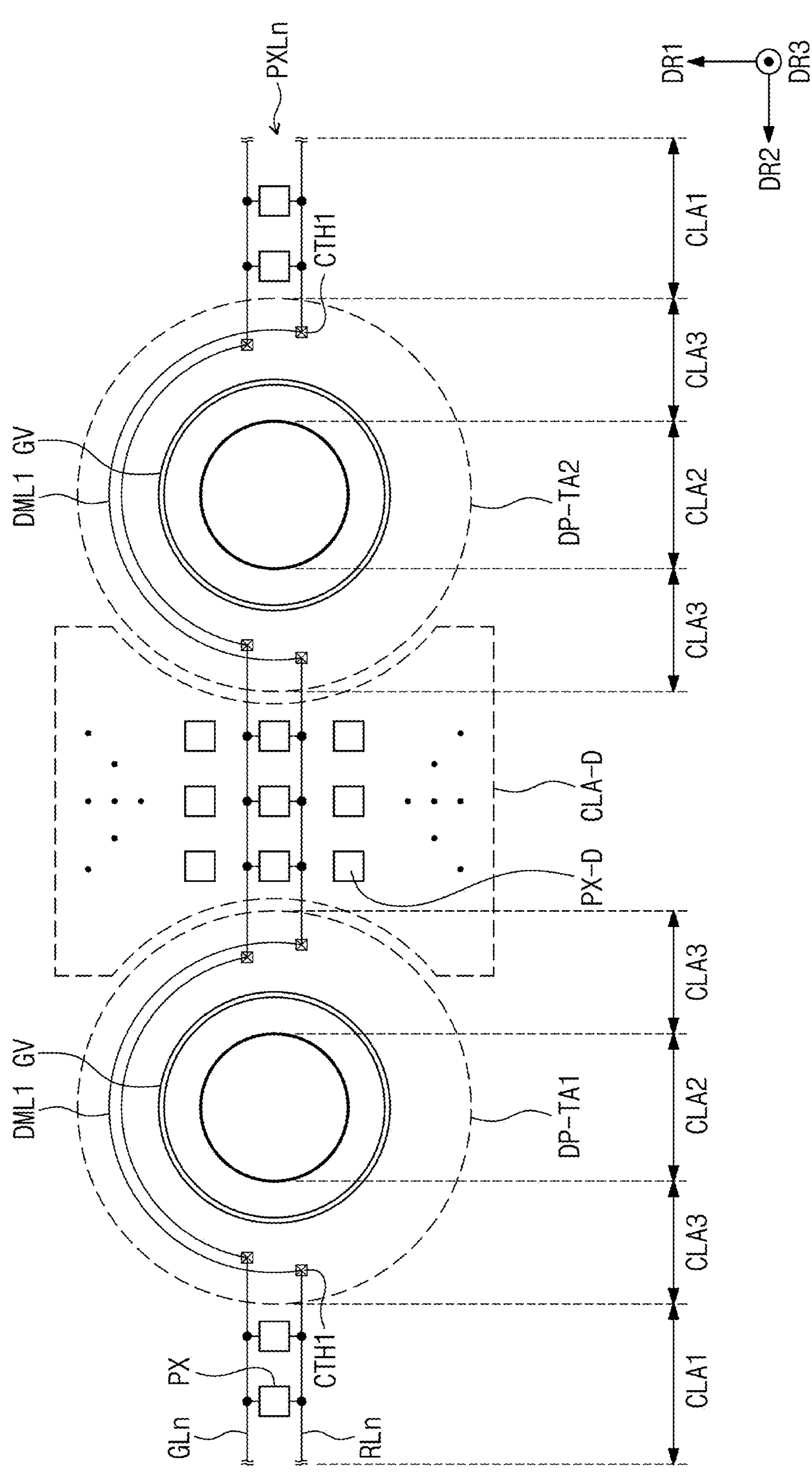
FIG. 8B is an enlarged plan view illustrating a portion of a display panel according to some exemplary embodiments.
Figure 8C:
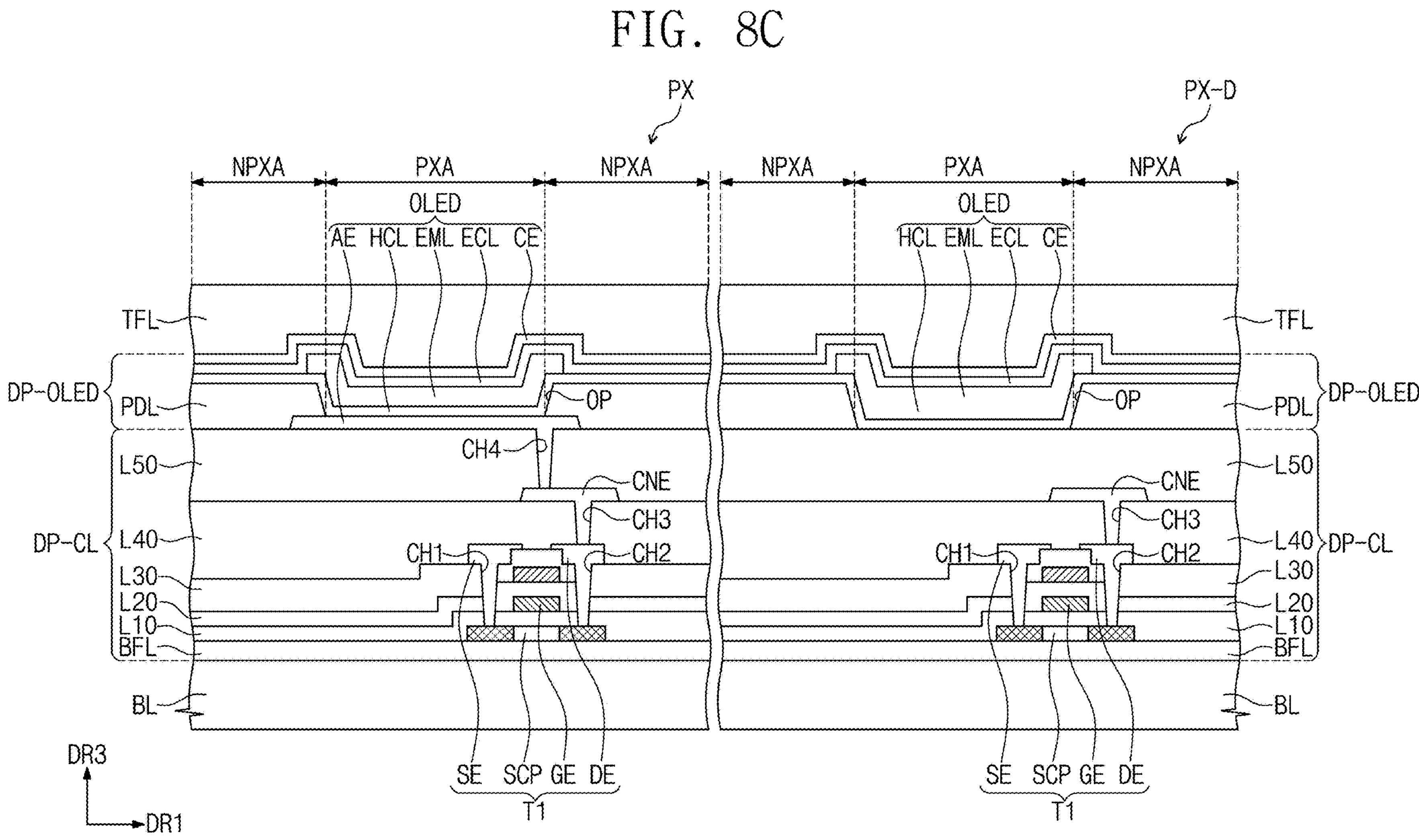
FIG. 8C is an enlarged cross-sectional view illustrating a portion of the display panel of FIG. 8B according to some exemplary embodiments.

FIG. 8A is an exploded perspective view illustrating an electronic device according to some exemplary embodiments. FIG. 8B is an enlarged plan view illustrating a portion of a display panel according to some exemplary embodiments. FIG. 8C is an enlarged cross-sectional view illustrating a portion of the display panel of FIG. 8B according to some exemplary embodiments.

Referring to FIG. 8A, the electronic device ED includes at least two signal passing regions TA1 and TA2. An electro-optical module ELM may include a light-emitting element LS and a photo sensor PS. The light-emitting element LS may emit infrared rays through a first signal passing region TA1, and the photo sensor PS may receive infrared rays reflected by an external object through a second signal passing region TA2. The light-emitting element LS and the photo sensor PS may perform the function of a proximity sensor. The light-emitting element LS and the photo sensor PS may be mounted on a circuit board PCB, or may be electrically connected through a flexible circuit board. In some exemplary embodiments, the electro-optical module ELM may also include two camera modules disposed to correspond to the two signal passing regions TA1 and TA2.

FIG. 8B schematically illustrates only an n-th pixel row PXLn. As illustrated in FIG. 8B, the display panel DP may include two second panel regions DP-TA1 and DP-TA2 corresponding respectively to the two signal passing regions TA1 and TA2. A circuit element layer DP-CL (see, e.g., FIG. 6C) may include two second regions CLA2 so as to correspond to the two second panel regions DP-TA1 and DP-TA2, and four third regions CLA3 so as to correspond to the two second panel regions DP-TA1 and DP-TA2.

The circuit element layer DP-CL may further include a dummy region CLA-D disposed between two adjacent third regions CLA3. A dummy pixel PX-D may be disposed in the dummy region CLA-D. A signal line and a dummy pixel driving circuit may be disposed in the dummy region CLA-D.

The dummy pixel PX-D may have a laminated structure of an organic light-emitting diode OLED (see, e.g., FIG. 6B) different from that of a pixel PX. As illustrated in FIG. 8C, the organic light-emitting diode OLED of the dummy pixel PX-D may not include a first electrode AE. In some exemplary embodiments, the organic light-emitting diode OLED of the dummy pixel PX-D may not include a second electrode CE, or may not include a light-emitting layer EML.

In some exemplary embodiments, the dummy pixel PX-D may have the same design of a pixel driving circuit CC as the pixel PX. An equivalent circuit of a plurality of transistors of the dummy pixel PX-D may be the same as that of a plurality of transistors of the pixel PX. In some exemplary embodiments, the dummy pixel PX-D may also have a pixel driving circuit CC different from that of the pixel PX. The number of the transistors constituting the pixel driving circuits CC may be different, or the transistors and a signal line (e.g., a scan line) may be disconnected.

Figure 9A:
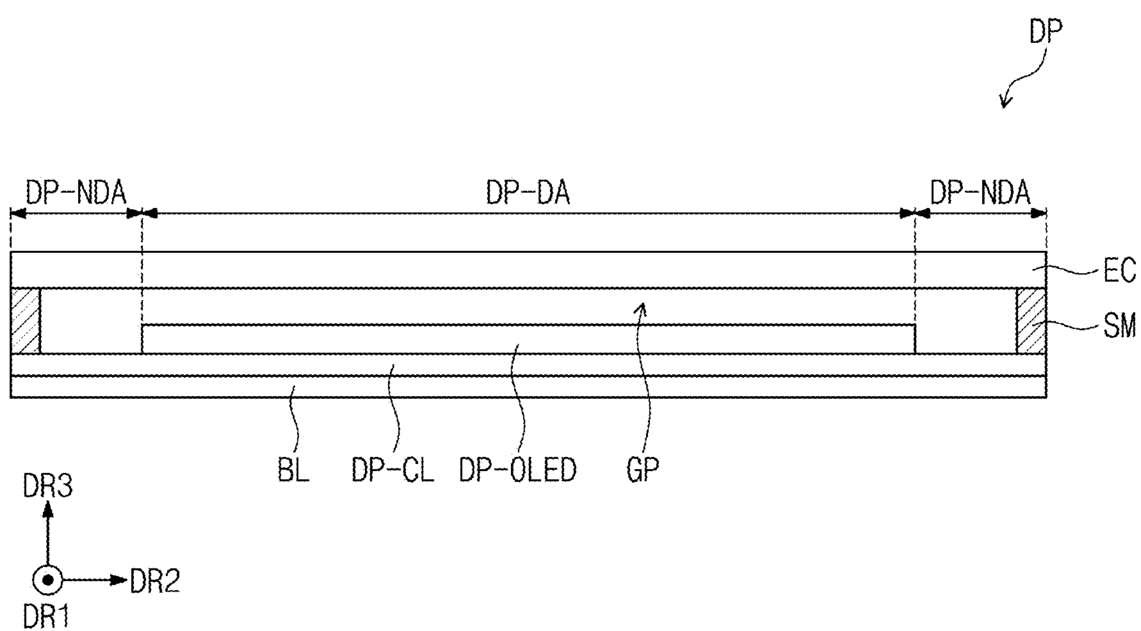
FIG. 9A is a cross-sectional view illustrating a display panel according to some exemplary embodiments.
Figure 9B:
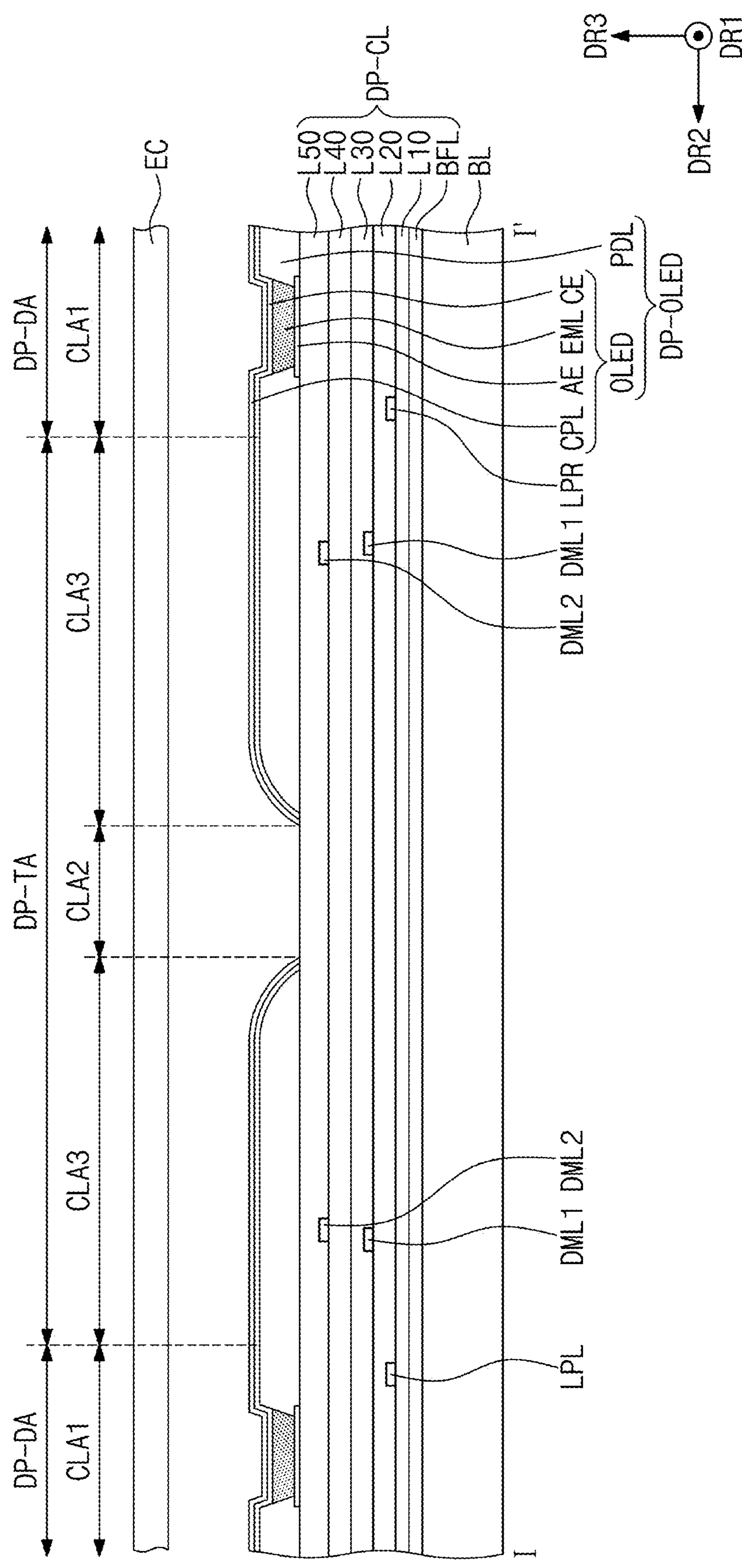
FIG. 9B is an enlarged cross-sectional view illustrating a portion of the display panel of FIG. 9A according to some exemplary embodiments.

FIG. 9A is a cross-sectional view illustrating a display panel according to some exemplary embodiments. FIG. 9B is an enlarged cross-sectional view illustrating a portion of the display panel of FIG. 9A according to some exemplary embodiments.

As seen in FIGS. 9A and 9B, the display panel DP does not include the thin film encapsulation layer TFE (see, e.g., FIG. 6C) when compared with the display panel DP illustrated in FIG. 5A. The display panel DP of FIGS. 9A and 9B includes an encapsulation substrate EC and a sealing member SM. A base layer BL may include a glass substrate. Additionally, the base layer BL may include a substrate having a substantially constant refractive index in the visible light wavelength range.

The encapsulation substrate EC may be a transparent substrate. The encapsulation substrate EC may include a glass substrate. Additionally, the encapsulation substrate EC may include a substrate having a substantially constant refractive index in the visible light wavelength range. The sealing member SM may bond the lower display substrate (e.g., the base layer BL) to the encapsulation substrate EC. The sealing member SM may extend along the edge of the encapsulation substrate EC.

A gap GP defined inside the display panel DP may be filled with air or one or more inert gases (hereinafter, external gases). The encapsulation substrate EC and the sealing member SM may prevent (or at least reduce) moisture from penetrating the lower display substrate.

The sealing member SM may include an adhesive layer of an inorganic material, such as a frit. The sealing member SM is not limited thereto, and may include an adhesive layer of an organic material. At least because the display panel DP may be completely sealed from the outside in some exemplary embodiments, the strength of the display panel DP may be improved and a defect of a light-emitting element may be prevented or at least reduced.

Unlike the display panel DP illustrated in FIG. 6C, the display panel DP of FIGS. 9A and 9B does not have a module hole MH defined therein. At least a non-deposited region corresponding to the module hole MH is defined in the display panel DP of FIGS. 9A and 9B. The non-deposited region may correspond to the second region CLA2 of FIG. 6C.

By not disposing a part or the whole of a circuit element layer DP-CL, or a part or the whole of a display element layer DP-OLED in the non-deposited region, the non-deposited region may have greater light transmittance than other regions. In some exemplary embodiments, the non-deposited region is illustrated such that conductive patterns of the circuit element layer DP-CL are not disposed in the non-deposited region and the whole of the display element layer DP-OLED is not disposed in the non-deposited region.

Figure 10A:
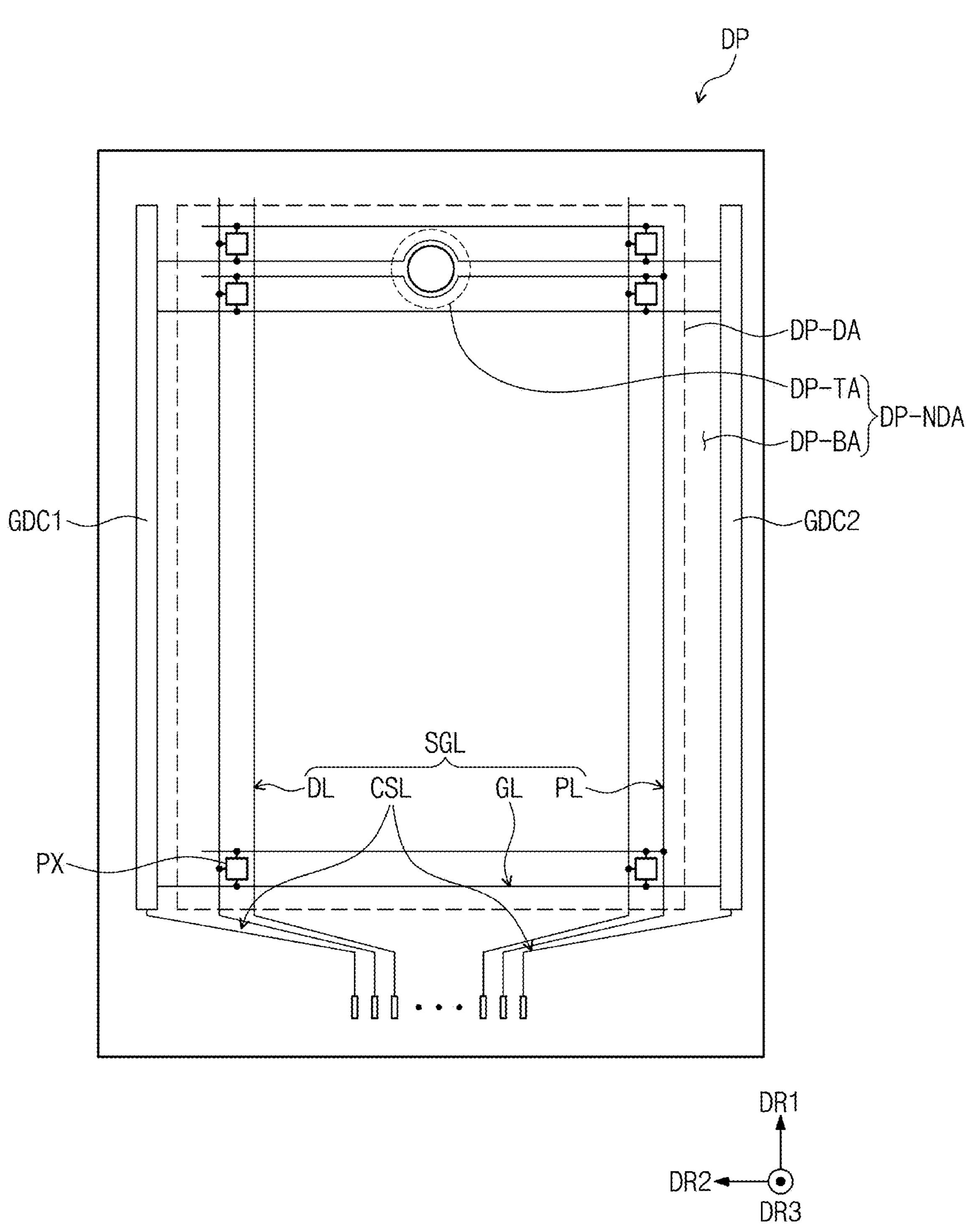
FIG. 10A is a plan view illustrating a display panel according to some exemplary embodiments.
Figure 10B:
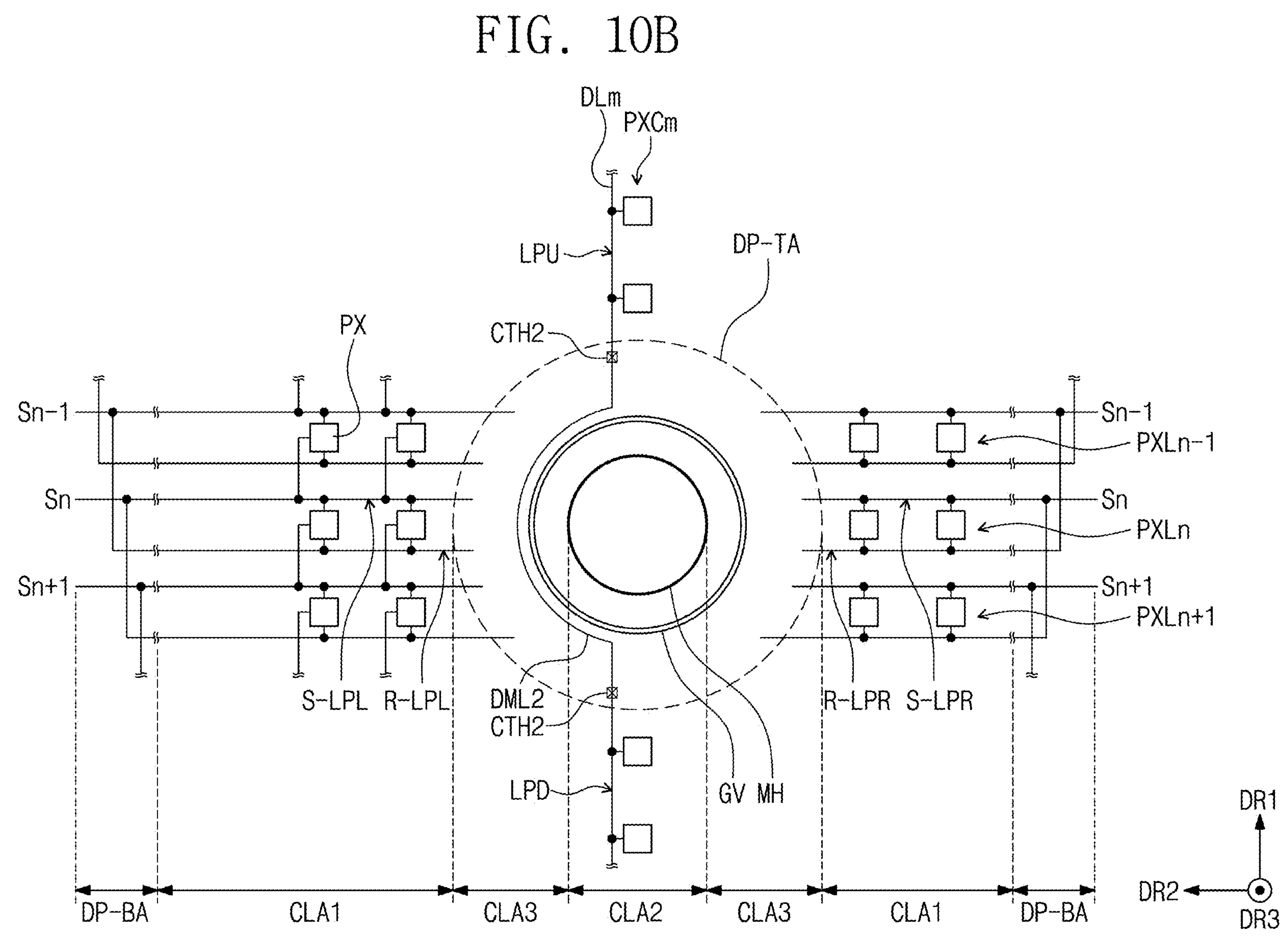
FIG. 10B is an enlarged plan view illustrating a portion of the display panel of FIG. 10A according to some exemplary embodiments.
Figure 10C:
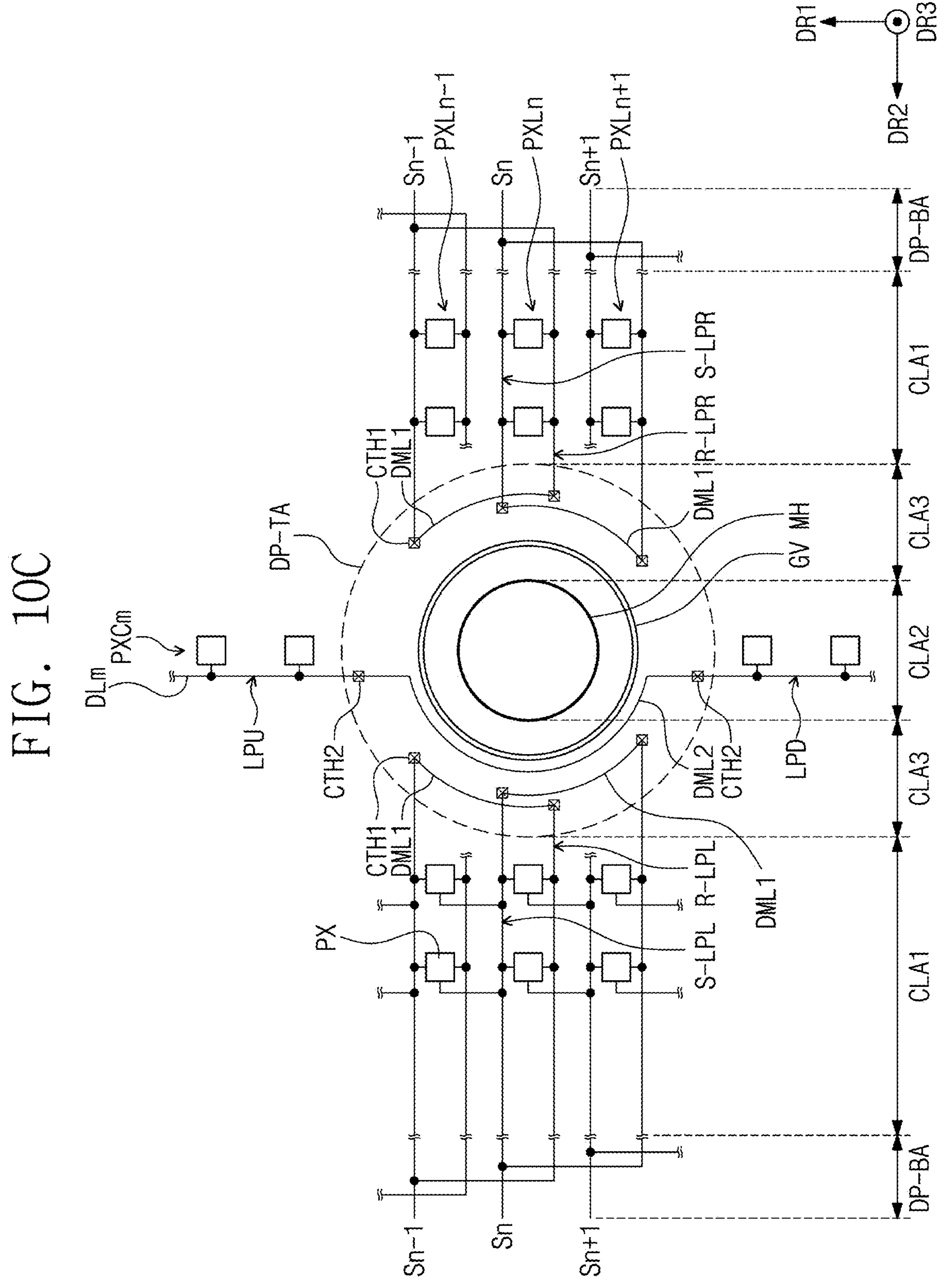
FIG. 10C is an enlarged plan view illustrating a portion of a display panel according to some exemplary embodiments.

FIG. 10A is a plan view illustrating a display panel according to some exemplary embodiments. FIG. 10B is an enlarged plan view illustrating a portion of the display panel of FIG. 10A according to some exemplary embodiments. FIG. 10C is an enlarged plan view illustrating a portion of a display panel according to some exemplary embodiments. Hereinafter, a detailed description will not be given of a component that is the same as that described in at least one of FIGS. 1 to 9B.

As illustrated in FIG. 10A, the display panel DP includes a first scan driving circuit GDC1 and a second scan driving circuit GDC2 with a first panel region DP-DA disposed therebetween.

The first scan driving circuit GDC1 may be the same as the scan driving circuit GDC described with reference to FIGS. 1 to 9B. The second scan driving circuit GDC2 is electrically connected to pixel rows divided by a second panel region DP-TA. The second scan driving circuit GDC2 is connected to row signal lines connected to the pixel rows divided by the second panel region DP-TA.

As illustrated in FIG. 10B, the row signal lines may include a one-side scan line S-LPL that is connected to one-side pixels of each of divided pixel rows PXLn−1, PXLn, and PXLn+1, and to the first scan driving circuit GDC1. The row signal lines may include another-side scan line S-LPR that is connected to another-side pixels of each of the divided pixel rows PXLn−1, PXLn, and PXLn+1, and to the second scan driving circuit GDC2. A one-side scan line S-LPL and another-side scan line S-LPR connected to an n-th pixel row PXLn constitute an n-th scan line GLn (see, e.g., FIG. 6D). The row signal lines may further include a one-side reset line R-LPL and another-side reset line R-LPR.

Ends of the row signal lines S-LPL, S-LPR, R-LPL, and R-LPR are illustrated to overlap a third region CLA3, but exemplary embodiments are not limited thereto. For instance, the ends of the row signal lines S-LPL, S-LPR, R-LPL, and R-LPR may not overlap the third region CLA3.

The first scan driving circuit GDC1 and the second scan driving circuit GDC2 respectively output scan signals synchronized with each other to a one-side scan line S-LPL and another-side scan line S-LPR corresponding to each other. The first scan driving circuit GDC1 and the second scan driving circuit GDC2 respectively output reset signals synchronized with each other to a one-side reset line R-LPL and another-side reset line R-LPR corresponding to each other.

As illustrated in FIG. 10C, the row signal lines may further include a plurality of first connection lines DML1 disposed in the third region CLA3. A first connection line DML1 may connect a one-side scan line S-LPL connected to an (n−1)-th pixel row PXLn−1 to a one-side reset line R-LPL connected to an n-th pixel row PXLn. A first connection line DML1 may connect another-side scan line S-LPR connected to the (n−1)-th pixel row PXLn−1 to another-side reset line R-LPR connected to the n-th pixel row PXLn. The two first connection lines DML1 illustrated in FIG. 10C may be the same as the one first connection line DML1 illustrated in FIG. 6D, but divided into two portions. According to some exemplary embodiments described in association with FIG. 10C, the resistance of the signal line may decrease, and, thus, a signal delay phenomenon (e.g., a resistance-capacitance (RC) delay) may be reduced.

According to various exemplary embodiments, an electronic device may provide a large display region and a small non-display region. For instance, an area of a second panel region that is a non-display region may be reduced. By reducing the number of the signal lines disposed in a third region of a circuit element layer, the area of the third region may become smaller. Further, by disposing a connection line on a layer different from layers of a scan line and a reset line, a signal line open failure due to static electricity may be prevented.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. An electronic device comprising:

a display panel comprising:

signal lines;

a first pixel;

a second pixel;

a third pixel;

a fourth pixel;

a fifth pixel; and a sixth pixel, wherein each of the first to sixth pixels comprises a light-emitting element, a first transistor electrically connected to the light-emitting element, and a second transistor electrically connected to a source or a drain of the first transistor, wherein a hole penetrates the display panel, the first pixel and the second pixel are disposed with the hole interposed therebetween and arranged in a same pixel row, the third pixel and the fourth pixel are disposed with the hole interposed therebetween and arranged in a same pixel row, and wherein the signal lines comprise:

a first-first line electrically connected to the second transistor of the first pixel;

a first-second line electrically connected to the second transistor of the second pixel;

a second-first line electrically connected to the second transistor of the third pixel;

a second-second line electrically connected to the second transistor of the fourth pixel;

a first-first data line electrically connected to the fifth pixel;

a first-second data line electrically connected to the sixth pixel; and a column connection line electrically connected to the first-first data line and the first-second data line, wherein the first-first line and the first-second line are disposed with the hole interposed therebetween and the second-first line and the second-second line are disposed with the hole interposed therebetween, the fifth pixel and the sixth pixel are disposed with the hole interposed therebetween and arranged in a same pixel column, the first-first data line and the first-second data line are disposed with the hole interposed therebetween, the column connection line is disposed outside the hole, the column connection line is arranged on a different layer from the first-first data line and the first-second data line, the column connection line is connected to the first-first data line through at least one first contact hole, and the column connection line is connected to the first-first data line through at least one second contact hole.

2. The electronic device of claim 1, further comprising an electro-optical module configured to transmit or receive an optical signal through the hole.

3. The electronic device of claim 1, further comprising an optical film on the display panel.

4. The electronic device of claim 1, wherein the first-first line and the first-second line are disposed with the column connection line interposed therebetween.

5. The electronic device of claim 1, wherein the column connection line is disposed between the hole and an end of the first-first line or between the hole and an end of the first-second line.

6. The electronic device of claim 1, wherein the first-first line and the column connection line are disposed on a same layer.

7. The electronic device of claim 1, wherein:

the fifth pixel and the sixth pixel are disposed with the hole interposed therebetween and arranged in a same pixel column;

the signal lines further comprise a data line electrically connected to the fifth pixel and the sixth pixel; and the first-first line and the first-second line are disposed with the data line interposed therebetween.

8. The electronic device of claim 1, wherein each of the first to sixth pixels further comprises a third transistor electrically connected to a gate of the first transistor, the signal lines further comprises a second-third line electrically connected to the third transistor of the third pixel and first-first line.

9. The electronic device of claim 1, wherein the first transistor comprises:

a semiconductor pattern;

a gate overlapping the semiconductor pattern;

the source of the first transistor extended from the semiconductor pattern; and the drain of the first transistor extended from the semiconductor pattern.

10. The electronic device of claim 9, wherein the first-first line and the second-first line are disposed in a same layer as the gate.

11. The electronic device of claim 1, wherein the display panel further comprises a first scan driving circuit electrically connected to the first-first line and the second-first line and a second scan driving circuit electrically connected to the first-second line and the second-second line.

12. The electronic device of claim 11, wherein the first scan driving circuit and the second scan driving circuit are disposed with the hole interposed therebetween.

* * * * *